US012684978B2

(12) United States Patent
Yang et al.

(10) Patent No.: US 12,684,978 B2
(45) Date of Patent: Jul. 14, 2026

(54) DISPLAY SUBSTRATE WITH SIGNAL LINES FORMING OVERLAPPING REGIONS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Huijuan Yang, Beijing (CN); Yang Zhou, Beijing (CN); Xiaofeng Jiang, Beijing (CN); Tinghua Shang, Beijing (CN); Gen Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/885,159

(22) Filed: Sep. 13, 2024

(65) Prior Publication Data

US 2025/0008796 A1 Jan. 2, 2025

Related U.S. Application Data

(63) Continuation of application No. 17/419,763, filed as application No. PCT/CN2020/114733 on Sep. 11, 2020, now Pat. No. 12,114,545.

(30) Foreign Application Priority Data

Jun. 5, 2020 (CN) .......................... 202010505924.2

(51) Int. Cl.
*H10K 59/131* (2023.01)
*G09G 3/20* (2006.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC .. H10K 59/1216; H10K 59/65; H10K 59/131; H10K 59/1213; G09F 9/33;
(Continued)

(56) References Cited

U.S. PATENT DOCUMENTS

| | | |
|---|---|---|
| 2014/0347401 A1 | 11/2014 | Hwang et al. |
| 2016/0218155 A1 | 7/2016 | Park et al. |

(Continued)

FOREIGN PATENT DOCUMENTS

| | | |
|---|---|---|
| CN | 107808634 A | 3/2018 |
| CN | 214956890 U | 11/2021 |

(Continued)

OTHER PUBLICATIONS

Chinese Office Action cited in Chinese Application No. 2020800025515, dated Mar. 12, 2025, with English Translation, 18 pages.
(Continued)

*Primary Examiner* — Yaron Cohen
(74) *Attorney, Agent, or Firm* — LEASON ELLIS LLP

(57) ABSTRACT

A display substrate and a display apparatus. In the display substrate, the first signal line sequentially passes through the first display region, the opening peripheral region and the second display region along a first direction, and includes a first lead line portion and a first winding portion that are in the opening peripheral region and connected to each other; the first winding portion partially surrounds the opening; the second signal line provides a second display signal to the pixel array, passes through the peripheral region of the opening along a second direction intersecting with the first direction, includes a second winding portion in the periph- (Continued)

eral region of the opening and partially surrounds the opening. The first lead line portion and the second signal line have a first overlapping region, and the first winding portion and the second winding portion have a second overlapping region.

20 Claims, 24 Drawing Sheets

(51) Int. Cl.
| | | |
|---|---|---|
| *G09G 3/3233* | (2016.01) | |
| *H10K 59/121* | (2023.01) | |
| *H10K 59/65* | (2023.01) | |

(52) U.S. Cl.
CPC ......... *G09G 3/2074* (2013.01); *G09G 3/3233* (2013.01); *G09G 2300/0426* (2013.01); *G09G 2300/0842* (2013.01); *H10K 59/65* (2023.02)

(58) Field of Classification Search
CPC ............... G02F 1/1343; G09G 3/2074; G09G 2300/0426; G09G 3/3233; G09G 2300/0842

See application file for complete search history.

(56) References Cited

U.S. PATENT DOCUMENTS

| | | | |
|---|---|---|---|
| 2017/0287992 A1 | 10/2017 | Kwak et al. | |
| 2019/0066561 A1 | 2/2019 | Yuan et al. | |
| 2020/0133415 A1* | 4/2020 | Choi | ..................... G06F 3/0412 |

FOREIGN PATENT DOCUMENTS

| | | | |
|---|---|---|---|
| CN | 215069990 U | 12/2021 | |
| JP | 2005165157 A | 6/2005 | |

OTHER PUBLICATIONS

Chinese Office Action cited in Chinese Application No. 2020800025248, dated Mar. 26, 2025, with English Translation, 15 pages.
German Office Action cited in German Application No. 1120200056074, dated Jul. 3, 2025, 32 pages.

* cited by examiner

I-I'

A1-B1

H-H'

2423          241  2301          2305     2306          2302  241          2423

A2-B2

GLn-1

CE12

CE11

CE10

GLn
(2301)

EM first row second row third row fourth row fifth row sixth row

A

B

C

D

E

A3–B3

DISPLAY SUBSTRATE WITH SIGNAL LINES FORMING OVERLAPPING REGIONS

CROSS REFERENCES TO RELATED APPLICATIONS

This patent application is a continuation of U.S. Ser. No. 17/419,763 filed on Jun. 30, 2021 which is a national stage application of international application PCT/CN2020/114733 filed on Sep. 11, 2020 and claims the priority of the Chinese Patent Application No. 202010505924.2 filed on Jun. 5, 2020, the entire contents of all these applications are hereby incorporated by reference herein in its entirety.

TECHNICAL FIELD

Embodiments of the present disclosure relate to a display substrate and a display apparatus.

BACKGROUND

At present, the display screen of the display apparatus is developing in a direction of large-screen and full-screen. Usually, a display apparatus (such as a mobile phone, a tablet computer, etc.) is provided with a camera device (or an imaging device), the camera device is usually arranged on a side outside a display region of the display screen. However, because the installation of the camera device needs to occupy a certain frame position, it is not conducive to a full screen and narrow frame design of the display screen. For example, the camera device can be combined and over-lapped with the display region of the display screen, a place is required to be reserved for the camera device in the display region to maximize the display region of the display screen.

SUMMARY

At least one embodiment of the present disclosure pro-vides a display substrate, and the display substrate includes a base substrate, a first signal line, and a second signal line. The base substrate includes a first opening region and a display region; the first opening region includes a first opening and a first opening peripheral region surrounding the first opening; the display region at least partially sur-rounds the first opening region, and the display region includes a first display region and a second display region. The first display region is located on a first side of the first opening region; the second display region is located on a second side of the first opening region, the first side and the second side are opposite to each other in a first direction, a whole of the first display region and the second display region includes a first pixel array; the first signal line is configured to provide a first display signal to the first pixel array, the first signal line sequentially passes through the first display region, the first opening peripheral region, and the second display region along the first direction, and includes a first lead line portion and a first winding line portion that are located in the first opening peripheral region; the first winding line portion partially surrounds the first opening, the first lead line portion is connected to the first winding line portion; the second signal line is configured to provide a second display signal to the first pixel array, the second signal line passes through the first opening peripheral region in a second direction intersecting the first direction, and includes a second winding line portion located in the first opening peripheral region, and the second winding line portion partially surrounds the first opening; an orthographic projection of the first lead line portion on the base substrate and an orthographic projection of the second signal line on the base substrate have a first overlapping region, an ortho-graphic projection of the first winding line portion on the base substrate and an orthographic projection of the second winding line portion on the base substrate have a second overlapping region, and an area of the first overlapping region is smaller than an area of the second overlapping region.

For example, in the display substrate provided by the present disclosure, the first winding line portion extends around the first opening from the first side of the first opening to the second side of the first opening, and the first side of the first opening and the second side of the first opening are opposite to each other in the first direction; and the second winding line portion extends around the first opening from a third side of the first opening to a fourth side of the first opening, and the third side and the fourth side are opposite to each other in the second direction.

For example, in the display substrate provided by the present disclosure, the first pixel array comprises a first pixel row and a second pixel row that respectively extend along the first direction, and the first pixel row and the second pixel row are both disconnected by the first opening region; the display substrate comprises a plurality of the first signal lines, and the plurality of the first signal lines comprise: the first signal line configured to provide the first display signal to the first pixel row, wherein the first winding line portion of the first signal line providing the first display signal to the first pixel row partially surrounds the first opening on a third side of the first opening; and the first signal line configured to provide the first display signal to the second pixel row, wherein the first winding line portion of the first signal line providing the first display signal to the second pixel row partially surrounds the first opening on a fourth side of the first opening.

For example, in the display substrate provided by the present disclosure, the first pixel array comprises a first pixel column and a second pixel column that respectively extend along the second direction; the display substrate comprises a plurality of the second signal lines, and the plurality of the second signal lines comprise: the second signal line config-ured to provide the second display signal to the first pixel column, wherein the second winding line portion of the second signal line providing the second display signal to the first pixel column protrudes toward the first side of the first opening and partially surrounds the first opening on the first side of the first opening; and the second signal line config-ured to provide the second display signal to the second pixel column, wherein the second winding line portion of the second signal line providing the second display signal to the second pixel column protrudes toward the second side of the first opening and partially surrounds the first opening on the second side of the first opening.

For example, in the display substrate provided by the present disclosure, the first winding line portion of the first signal line providing the first display signal to the first pixel row, and the first winding line portion of the first signal line providing the first display signal to the second pixel row are substantially symmetrical with respect to a symmetry axis along the first direction; and the second winding line portion of the second signal line providing the second display signal to the first pixel column, and the second winding line portion of the second signal line providing the second display signal to the second pixel column are substantially symmetrical with respect to a symmetry axis along the second direction.

For example, in the display substrate provided by the present disclosure, a planar shape of the first winding line portion and a planar shape of the second winding line portion respectively constitute a part of a concentric ring of a planar shape of the first opening.

For example, in the display substrate provided by the present disclosure, a planar shape of the first winding line portion and a planar shape of the second winding line portion respectively comprise an arc shape, or respectively comprise an arc shape and a straight line segment.

For example, in the display substrate provided by the present disclosure, the first signal line is a gate scanning signal line, and the first display signal is a gate scanning signal.

For example, in the display substrate provided by the present disclosure, the display region comprises a plurality of pixels, each of the pixels comprises a plurality of sub-pixels, each of the sub-pixels comprises a pixel circuit, and the pixel circuit comprises: a transistor, a light-emitting element and a storage capacitor. The transistor comprises an active layer, a gate electrode, a source electrode and a drain electrode; a light-emitting element connected to one of the source electrode and the drain electrode of the transistor; and the storage capacitor comprises a first electrode plate and a second electrode plate, the gate electrode, and the first signal line and the first electrode plate of the storage capacitor are in a same layer.

For example, the display substrate provided by the present disclosure further comprises: a third display region and a plurality of third signal lines. The third display region is on at least one side of both the first display region and the second display region in the second direction, the third display region is connected to both the first display region and the second display region, the third display region comprises a second pixel array, and the second pixel array comprises a plurality of rows of pixels and a plurality of columns of pixels; the plurality of third signal lines which are configured to respectively provide a third scanning signal to the plurality of rows of pixels comprised in the second pixel array and extend along the first direction, wherein the second signal line is further configured to provide the second display signal to the plurality of columns of pixels of the second pixel array.

For example, in the display substrate provided by the present disclosure, a total number of pixels comprised in each row of pixels of the second pixel array is more than a total number of pixels comprised in the first pixel row of the first pixel array and is more than a total number of pixels comprised in the second pixel row of the first pixel array.

For example, in the display substrate provided by the present disclosure, the second signal line comprises a data line, and the data line is configured to provide a data signal to at least part of the sub-pixels for controlling a light-emitting gray value of the at least part of the sub-pixels.

For example, the display substrate provided by the present disclosure further comprises a first power line. The first power line is connected to a first voltage terminal, is configured to provide a first power supply voltage to the pixel circuit, is connected to the second electrode plate of the storage capacitor, and comprises a plurality of first sub-wirings extending along the first direction and a plurality of second sub-wirings extending along the second direction; a first part the first sub-wirings among the plurality of first sub-wirings are disconnected in the first opening region, and a second part of first sub-wirings among the plurality of first sub-wirings pass through the third display region; the first part of second sub-wirings among the plurality of second sub-wirings are disconnected in the first opening region, the second part of second sub-wirings among the plurality of second sub-wirings sequentially pass through the first display region and the third display region, or sequentially pass through the second display region and the third display region; and the first part of first sub-wirings are electrically connected respectively in the first display region and the second display region with at least one second sub-wiring of the second part of second sub-wirings, and the first part of second sub-wirings are electrically connected in the third display region with at least one first sub-wiring in the second part of the first sub-wirings.

For example, in the display substrate provided by the present disclosure, the first sub-wirings and the second electrode plate of the storage capacitor are in a same layer; and the second sub-wirings and the data line are in a same layer.

For example, the display substrate provided by the present disclosure further comprises a first power line. The first power line is connected to a first voltage terminal and is configured to provide a first power voltage to the pixel circuit, the first power line is connected to the second electrode plate of the storage capacitor, and the first power line comprises a plurality of first sub-wirings extending along the first direction and a plurality of second sub-wirings extending along the second direction; and the second signal line comprises the second sub-wirings, and the second sub-wirings sequentially pass through the first opening peripheral region and the third display region.

For example, the display substrate provided by the present disclosure further comprises a second opening region and an inter-opening region; the second opening region is adjacent to the first opening region, and the second opening region comprises a second opening and a second opening peripheral region surrounding the second opening; and the inter-opening region between the first opening region and the second opening region.

For example, in the display substrate provided by the present disclosure, the second opening region and the first opening region are arranged along the first direction; the first display region is on a side of the first opening region away from the inter-opening region, the second display region is on a side of the second opening region away from the inter-opening region; and the first signal line sequentially passes through the first display region, the first opening peripheral region, the inter-opening region, the second opening peripheral region, and the second display region along the first direction.

For example, in the display substrate provided by the present disclosure, the second opening region and the first opening region are arranged along the second direction; and the second signal line sequentially passes through the first opening peripheral region, the inter-opening region, the second opening peripheral region, and the third display region along the second direction.

For example, in the display substrate provided by the present disclosure, at least one selected from a group consisting of the inter-opening region, the first opening peripheral region, and the second opening peripheral region comprises a first virtual sub-pixel, the first virtual sub-pixel comprises a first virtual pixel circuit, and the first virtual pixel circuit comprises a first compensation capacitor; the first compensation capacitor comprises: a first electrode plate which is in a same layer as the first signal line and is electrically connected to the first signal line; and a second electrode plate, wherein the second electrode plate and the first electrode plate of the first compensation capacitor are in different layers, the second electrode plate of first compensation capacitor is insulated from the first electrode plate of the first compensation capacitor, and an orthographic projection of the first electrode plate of the first compensation capacitor on the base substrate at least partially overlaps with an orthographic projection of the second electrode plate of the first compensation capacitor on the base substrate.

For example, in the display substrate provided by the present disclosure, the second electrode plate of the first compensation capacitor and the second electrode plate of the storage capacitor are in a same layer.

For example, in the display substrate provided by the present disclosure, the first electrode plate of the first compensation capacitor is disconnected to other parts of the first virtual pixel circuit except for the first signal line.

For example, in the display substrate provided by the present disclosure, the inter-opening region comprises a second virtual sub-pixel, the second virtual sub-pixel comprises a second virtual pixel circuit, and the second virtual pixel circuit comprises a second compensation capacitor; a first electrode plate of the second compensation capacitor is in a same layer as the first signal line and is electrically connected to the first signal line; and an orthographic projection of the first signal line on the base substrate at least partially overlaps with an orthographic projection of a second electrode plate of the second compensation capacitor on the base substrate.

For example, in the display substrate provided by the present disclosure, the second electrode plate of the second compensation capacitor comprises: a first body portion and a first extension portion. The first body portion is on a first side of the first signal line in the second direction; the first extension portion extends from the first body portion toward the first signal line in the second direction, and an orthographic projection of the first signal line on the base substrate at least partially overlaps with an orthographic projection of the first extension portion on the base substrate.

For example, in the display substrate provided by the present disclosure, the second electrode plate of the second compensation capacitor and the second electrode plate of the first compensation capacitor are in a same layer.

For example, in the display substrate provided by the present disclosure, the first electrode plate of the second compensation capacitor comprises: a second body portion, a second extension portion and a third extension portion. The second body portion is on a first side of the first signal line in the second direction; the second extension portion extends from the second body portion toward the first signal line in the second direction, and is between the second body portion and the first signal line, wherein the second body portion is electrically connected to the first signal line through the second extension portion; the third extension portion extends along the second direction and extends from the first signal line to the direction away from the second body portion, the third extension portion is located on a second side of the first signal line in the second direction and is electrically connected to the first signal line, and the second side of the first signal line is opposite to the first side of the first signal line.

For example, in the display substrate provided by the present disclosure, an orthographic projection of the first electrode plate of the second compensation capacitor on the base substrate is within an orthographic projection of the second electrode plate of the second compensation capacitor on the base substrate.

For example, in the display substrate provided by the present disclosure, the first body portion and the first extension portion are integral; the second body portion, the second extension portion, the first signal line and the third extension portion are integral.

For example, in the display substrate provided by the present disclosure, the second virtual sub-pixel comprises: a first virtual semiconductor layer which is on a side of the first electrode plate of the second compensation capacitor close to the base substrate, and comprises a first part and a second part that are spaced apart from each other so as not to be connected to each other, the first part of the first virtual semiconductor layer is on the first side of the first signal line, and the second part of the first virtual semiconductor layer is on the second side of the first signal line; and an orthographic projection of the first signal line on the base substrate does not overlap with an orthographic projection of the first virtual semiconductor layer on the base substrate.

For example, in the display substrate provided by the present disclosure, both the first part and the second part of the first virtual semiconductor layer are configured to be sent to electrical signals through the second virtual pixel circuit; and the first part of the first virtual semiconductor layer is provided a first end and a second end opposite to each other in the first direction, the second end is configured to be sent to electrical signals through the second virtual pixel circuit, and the first end is connected to the second end.

For example, in the display substrate provided by the present disclosure, the inter-opening region further comprises third virtual sub-pixels, each of the third virtual sub-pixels comprises a third virtual pixel circuit, and the third virtual pixel circuit comprises: a second virtual semiconductor layer; the second virtual semiconductor layer comprises a first part and a second part spaced apart so as not to be connected to each other, the first part of the second virtual semiconductor layer is located on the first side of the first signal line, the first part of the second virtual semiconductor layer is located on the second side of the first signal line; and the orthographic projection of the first signal line on the base substrate does not overlap with an orthographic projection of the second virtual semiconductor layer on the base substrate.

For example, in the display substrate provided by the present disclosure, the third virtual pixel circuit and the pixel circuit are provided with a same circuit design, except that the second virtual semiconductor layer in the third virtual pixel circuit is disconnected.

At least one embodiment of the present disclosure further provides a display substrate, the display substrate includes: a base substrate, a first signal line, and a second signal line. The base substrate includes: a first opening region, a second opening region, an inter-opening region, and a display region. The first opening region includes a first opening and a first opening peripheral region surrounding the first opening; the second opening region is arranged adjacent to the first opening region, and the second opening region includes a second opening and a second opening peripheral region surrounding the second opening; the inter-opening region is located between the first opening region and the second opening region, at least one of the inter-opening region, the first opening peripheral region, and the second opening peripheral region includes a first virtual sub-pixel; the display region at least partially surrounds the first opening region, the second opening region and the inter-opening region, and the display region includes a pixel array; the first signal line extends through the inter-opening region, and is configured to provide a first display signal to the pixel array and passes through the first virtual sub-pixel, the first virtual sub-pixel includes a first virtual pixel circuit, and the first virtual pixel circuit includes a first compensation capacitor. The first compensation capacitor includes: a first electrode plate and a second electrode plate. The first electrode plate of the first compensation capacitor is arranged on a same layer as the first signal line and is electrically connected to the first signal line; the second electrode plate and the first electrode plate of the first compensation capacitor are arranged on different layers and are insulated from each other, and an orthographic projection of the second electrode plate of the first compensation capacitor on the base substrate at least partially overlaps with an orthographic projection of the first electrode plate of the first compensation capacitor on the base substrate.

For example, in the display substrate provided by the present disclosure, the first signal line extends along a first direction, the first opening region and the second opening region are adjacent to each other along the first direction; a second direction is perpendicular to the first direction; the first electrode plate of the first compensation capacitor comprises: a first body portion and a first extension portion and a first extension portion. The first body portion is on a first side of the first signal line in the second direction; the first extension portion extends from the first body portion toward the first signal line, is located on the first side of the first signal line in the second direction, and between the first body portion and the first signal line; the first body portion is electrically connected to the first signal line through the first extension portion.

For example, in the display substrate provided by the present disclosure, the first electrode plate of the first compensation capacitor further comprises: a second extension portion which extends from the first signal line in a direction away from the first body portion, and is located on the second side of the first signal line in the second direction and is electrically connected to the first signal line, and the second side is opposite to the first side.

For example, in the display substrate provided by the present disclosure, the first body portion, the first extension portion, the first signal line and the second extension portion are integral.

For example, in the display substrate provided by the present disclosure, a width of the first extension portion in the first direction, a width of the second extension portion in the first direction and a width of the first body portion in the first direction are substantially equal to each other.

For example, in the display substrate provided by the present disclosure, the display region comprises: a first display region and a second display region. The first display region is on a side of the first opening region away from the inter-opening region; the second display region is on a side of the second opening region away from the inter-opening region; a whole of the first display region and the second display region comprises a first pixel array, the first pixel array comprises a first pixel row and a second pixel row that respectively extend along the first direction, both the first pixel row and the second pixel row are disconnected by a whole formed of the first opening region, the inter-opening region, and the second opening region; the first signal line sequentially passes through the first display region, the first opening peripheral region, the inter-opening region, the second opening peripheral region, and the second display region along the first direction; and the display substrate comprises: the first signal line configured to provide the first display signal to the first pixel row, and the first signal line configured to provide the first display signal to the second pixel row.

For example, in the display substrate provided by the present disclosure, the inter-opening region comprises a first virtual sub-pixel row corresponding to the first pixel row and a second virtual sub-pixel row corresponding to the second pixel row; the first signal line configured to provide the first display signal for the first pixel row passes through the first pixel row and the first virtual pixel row, the first signal line configured to provide the first display signal for the second pixel row passes through the second pixel row and the second virtual pixel row; a total number of pixels in the first pixel row is different from a total number of pixels in the second pixel row, and a total number of the first compensation capacitors in the first virtual pixel row is different from a total number of the first compensation capacitors in the second virtual pixel row.

For example, in the display substrate provided by the present disclosure, the first signal line is a gate scanning signal line, and the first display signal is a gate scanning signal.

For example, in the display substrate provided by the present disclosure, the display region comprises a plurality of pixels, each of the pixels comprises a plurality of sub-pixels, and each of the sub-pixels comprises a pixel circuit; the pixel circuit comprises: a transistor, a light-emitting element and a storage capacitor. The transistor comprises an active layer, a gate electrode, a source electrode and a drain electrode; the light-emitting element connected to one of the source electrode and the drain electrode of the transistor; the storage capacitor comprises a first electrode plate and a second electrode plate; the gate electrode, the first signal line, the first electrode plate of the storage capacitor, and the first electrode plate of the first compensation capacitor are in a same layer.

For example, in the display substrate provided by the present disclosure, the first electrode plate of the storage capacitor and the first signal line are spaced apart from each other, and the first electrode plate of the storage capacitor and the gate electrode are spaced apart from each other.

For example, in the display substrate provided by the present disclosure, the second electrode plate of the first compensation capacitor and the second electrode plate of the storage capacitor are in a same layer.

For example, in the display substrate provided by the present disclosure, the first electrode plate of the first compensation capacitor is disconnected to other parts of the first virtual pixel circuit except for the first signal line.

For example, in the display substrate provided by the present disclosure, the first virtual pixel circuit further comprises: a first transfer electrode which is electrically connected to the first electrode plate of the first compensation capacitor and is disconnected to other parts of the first virtual pixel circuit except for the first signal line.

For example, in the display substrate provided by the present disclosure, the first virtual pixel circuit comprises a first virtual semiconductor layer, the first virtual semiconductor layer is on a side of the first signal line close to the substrate plate; and the display substrate further comprises: a disconnection electrode which is electrically connected to the first virtual semiconductor layer, in a same layer as the first transfer electrode, and spaced apart from the first transfer electrode so as not to be connected to the first transfer electrode.

For example, in the display substrate provided by the present disclosure, the first virtual pixel circuit has a same circuit design as the pixel circuit, except for the first electrode plate of the first compensation capacitor and the disconnection between first electrode plate of the first compensation capacitor and other parts of the first virtual pixel circuit.

For example, in the display substrate provided by the present disclosure, the inter-opening region further comprises: a second virtual sub-pixel; the second virtual sub-pixel comprises a second virtual pixel circuit, and the second virtual pixel circuit comprises a second compensation capacitor; the first electrode plate of the second compensation capacitor is in a same layer as the first signal line and is electrically connected to the first signal line; and an orthographic projection of the first signal line on the base substrate at least partially overlaps with an orthographic projection of a second electrode plate of the second compensation capacitor on the base substrate.

For example, in the display substrate provided by the present disclosure, the second electrode plate of the second compensation capacitor comprises: a second body portion and a third extension portion. The second body portion is on the first side of the first signal line in the second direction; and the third extension portion extends from the second body portion toward the first signal line in the second direction, and the orthographic projection of the first signal line on the base substrate at least partially overlaps with an orthographic projection of the third extension portion on the base substrate.

For example, in the display substrate provided by the present disclosure, the second electrode plate of the second compensation capacitor and the second electrode plate of the first compensation capacitor are in a same layer.

For example, in the display substrate provided by the present disclosure, the first electrode plate of the second compensation capacitor comprises: a third body portion and a fourth extension portion. The third body portion is on the first side of the first signal line in the second direction; and the fourth extension portion extend from the third body portion toward the first signal line in the second direction, and is between the third body portion and the first signal line; the third body portion is electrically connected to the first signal line through the fourth extension portion.

For example, in the display substrate provided by the present disclosure, an orthographic projection of the first electrode plate of the second compensation capacitor on the base substrate is within an orthographic projection of the second electrode plate of the second compensation capacitor on the base substrate.

For example, in the display substrate provided by the present disclosure, the second virtual sub-pixel circuit comprises a second transfer electrode, and the second transfer electrode is in a same layer as the first transfer electrode and is electrically connected to the second electrode plate of the second compensation capacitor.

For example, in the display substrate provided by the present disclosure, the second virtual sub-pixel comprises: a first virtual semiconductor layer comprising a first part and a second part that are spaced apart from each other so as not to be connected to each other, wherein the first part is on the first side of the first signal line, and the second part is on the second side of the first signal line; and the orthographic projection of the first signal line on the base substrate does not overlap with an orthographic projection of the first virtual semiconductor layer on the base substrate.

For example, in the display substrate provided by the present disclosure, the second part of the first virtual semiconductor layer is configured to be provided with an electrical signal through the second virtual pixel circuit; the first part of the first virtual semiconductor layer has a first end and a second end that are opposite to each other in the first direction, the second end is configured to be provided with the electrical signal through the second virtual pixel circuit, and the first end is connected to the second end.

For example, in the display substrate provided by the present disclosure, the inter-opening region further comprises a third virtual sub-pixel, the third virtual sub-pixel comprises a third virtual pixel circuit, and the third virtual pixel circuit comprises: a second virtual semiconductor layer; the second virtual semiconductor layer comprises a first part and a second part that are spaced apart from each other so as not to be connected to each other, the first part of the second virtual semiconductor layer is on the first side of the first signal line, the first part of the second virtual semiconductor layer is located on the second side of the first signal line; and the orthographic projection of the first signal line on the base substrate does not overlap with an orthographic projection of the third virtual semiconductor layer on the base substrate.

For example, in the display substrate provided by the present disclosure, the third virtual sub-pixel has a same circuit design as the pixel circuit, except for the disconnection of the second virtual semiconductor layer.

For example, in the display substrate provided by the present disclosure, the display region further comprises a third display region. The third display region is on at least one side of both the first display region and the second display region in the second direction, is connected to both the first display region and the second display region, and comprises a second pixel array; the second pixel array comprises a plurality of rows and a plurality of columns of pixels, the third display region comprises a plurality of third signal lines which respectively provide scanning signals to each row of pixels among the plurality of rows of pixels and the plurality of columns of pixels and extend along the first direction; and a total number of pixels comprised in each row of the pixels of the second pixel array is more than both a total number of pixels comprised in the first pixel row of the first pixel array and a total number of pixels comprised in the second pixel row of the first pixel array.

At least one embodiment of the present disclosure provides a display apparatus comprising any one of the display substrates mentioned above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. Similarly, similar words such as "a", "a" or "the" do not indicate the limitation of quantity, but indicate the existence of at least one. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "left," "right" and the like are only used to indicate relative position relationship, and in the case that the position of an object is described as being changed, the relative position relationship may be changed accordingly.

In the following description, in the case that it is mentioned that two or more components are "integral", it means that these components are formed by at least a same raw material layer, for example, formed by performing a same patterning process on a same film, so that these components are continuous and no interface exists between them.

Figure 1:
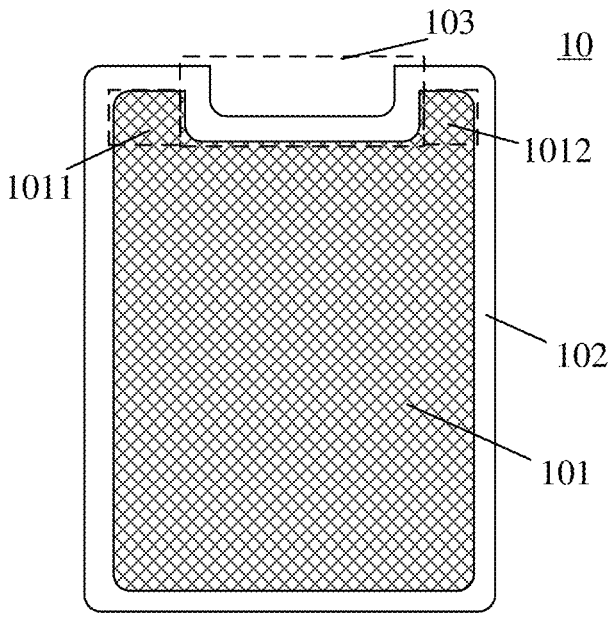
FIG. 1 is a planar schematic diagram of a display substrate.

FIG. 1 is a planar schematic diagram of the display substrate. As illustrated in FIG. 1, the display substrate 10 includes a display region 101 and a peripheral region 102 surrounding the display region 101, the display region 101 is designed to be in an irregular shape with a notch 103 on at least one side, for example, devices such as a camera, and a distance sensor, can be arranged in the region of the notch 103 in the display substrate 10, thereby helping to realize a narrow frame design of the display substrate 10.

As illustrated in FIG. 1, the display region 101 includes a first display region 1011 and a second display region 1012 that are respectively located on a left side of the notch 103 and a right side of the notch 103, the first display region 1011 and the second display region 1012 are at a same horizontal position relative to a bottom edge (a lower edge in the figure) of the display region 101, for example, the first display region 1011 and the second display region 1012 are driven by same one or more scanning signal lines (gate lines) extending left and right horizontally in the figure. Of course, in some other embodiments, the first display region and the second display region may be at different horizontal positions, for example, in the case that the display screen adopted in the display substrate is a special-shaped (non-rectangular or non-rectangular-like) display screen, in the special-shaped screen, for example, the first display region and the second display region are arranged along a curved edge of the display screen, and the first display region and the second display region may not be in a same horizontal position. Because of the existence of the notch 103, a total number of the pixels in a same row in the first display region 1011 and the second display region 1012, is less than a total number of the pixels in a same row in other parts of the display region 101 except for the first display region 1011 and the second display region 1012 (for example, a middle part of the display region 101 in FIG. 1). Therefore, in the display substrate 10, the number of, the pixels connected to a horizontally extending signal line which provides a display signal (such as scanning signals) to the pixels in the same row in both the first display region 1011 and the second display region 1012, is different from the number of the pixels connected to a signal line which provides an electrical signal (such as a scanning signal) to a row of pixels in other parts of the display region 101 except for the first display region 1011 and the second display region 1012, and in the case that the notch 103 is in an irregular shape (such as a trapezoid shape, a drop shape, and so on), the number of the pixels in in different rows of pixels in the first display region 1011 and the second display region 1012 that may also be different. Therefore, in the display substrate 10, because the numbers of pixels in different rows are different, the loads of the signal lines connecting with different rows of pixels are different, further the speeds of signal transmission on these signal lines are different, and deviations between actual display signals and the design values are different, which affects the display effect of the display substrate.

For example, load compensation can be performed on these signal lines with different loads, so that the loads of these signal lines are basically the same, and an adverse effect on display quality due to the arrangement of the notch 103 is reduced.

At least one embodiment of the present disclosure provides a display substrate, and the display substrate includes a base substrate, a first signal line, and a second signal line. The base substrate includes a first opening region and a display region; the first opening region includes a first opening and a first opening peripheral region surrounding the first opening; the display region at least partially surrounds the first opening region, and the display region includes a first display region and a second display region. The first display region is located on a first side of the first opening region; the second display region is located on a second side of the first opening region, the first side and the second side are opposite to each other in a first direction, a whole of the first display region and the second display region includes a first pixel array; the first signal line is configured to provide a first display signal to the first pixel array, the first signal line sequentially passes through the first display region, the first opening peripheral region, and the second display region along the first direction, and includes a first lead line portion and a first winding line portion that are located in the first opening peripheral region; the first winding line portion partially surrounds the first opening, the first lead line portion is connected to the first winding line portion; the second signal line is configured to provide a second display signal to the first pixel array, the second signal line passes through the first opening peripheral region in a second direction intersecting the first direction, and includes a second winding line portion located in the first opening peripheral region, and the second winding line portion partially surrounds the first opening; an orthographic projection of the first lead line portion on the base substrate and an orthographic projection of the second signal line on the base substrate have a first overlapping region, an orthographic projection of the first winding line portion on the base substrate and an orthographic projection of the second winding line portion on the base substrate have a second overlapping region, and an area of the first overlapping region is smaller than an area of the second overlapping region.

At least one embodiment of the present disclosure further provides a display substrate, the display substrate includes: a base substrate, a first signal line, and a second signal line. The base substrate includes: a first opening region, a second opening region, an inter-opening region, and a display region. The first opening region includes a first opening and a first opening peripheral region surrounding the first opening; the second opening region is arranged adjacent to the first opening region, and the second opening region includes a second opening and a second opening peripheral region surrounding the second opening; the inter-opening region is located between the first opening region and the second opening region, at least one of the inter-opening region, the first opening peripheral region, and the second opening peripheral region includes a first virtual sub-pixel; the display region at least partially surrounds the first opening region, the second opening region and the inter-opening region, and the display region includes a pixel array; the first signal line extends through the inter-opening region, and is configured to provide a first display signal to the pixel array and passes through the first virtual sub-pixel, the first virtual sub-pixel includes a first virtual pixel circuit, and the first virtual pixel circuit includes a first compensation capacitor. The first compensation capacitor includes: a first electrode plate and a second electrode plate. The first electrode plate of the first compensation capacitor is arranged on a same layer as the first signal line and is electrically connected to the first signal line; the second electrode plate and the first electrode plate of the first compensation capacitor are arranged on different layers and are insulated from each other, and an orthographic projection of the second electrode plate of the first compensation capacitor on the base substrate at least partially overlaps with an orthographic projection of the first electrode plate of the first compensation capacitor on the base substrate.

In the following, the present disclosure will be described by several specific embodiments. In order to keep the following descriptions of the embodiments of the present invention clear and concise, detailed descriptions of known functions and known components may be omitted. In the case that any one of components of the embodiments of the present invention appears in more than one drawing, the component is represented by the same reference number in each of the drawings.

Figure 2A:
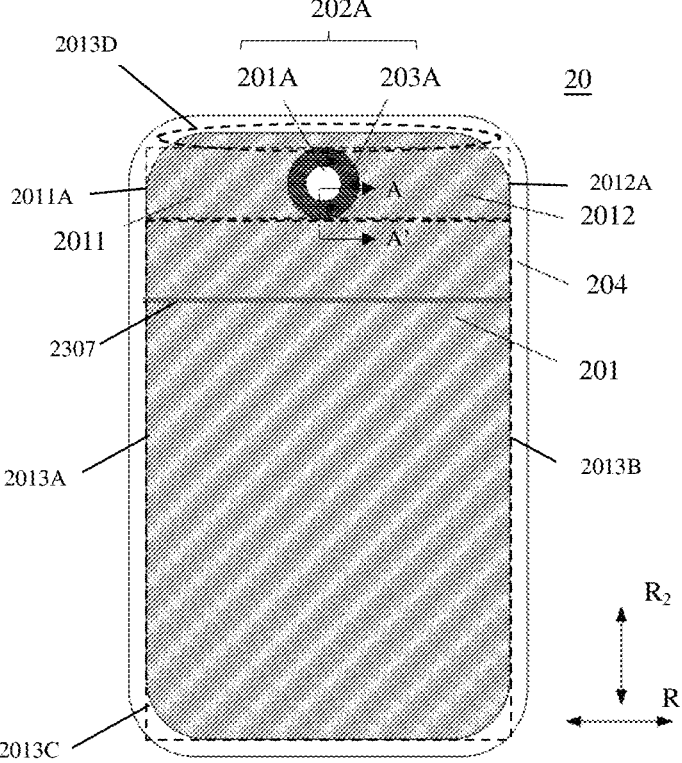
FIG. 2A is a planar schematic diagram of a display substrate provided by at least one embodiment of the present disclosure.
Figure 2B:
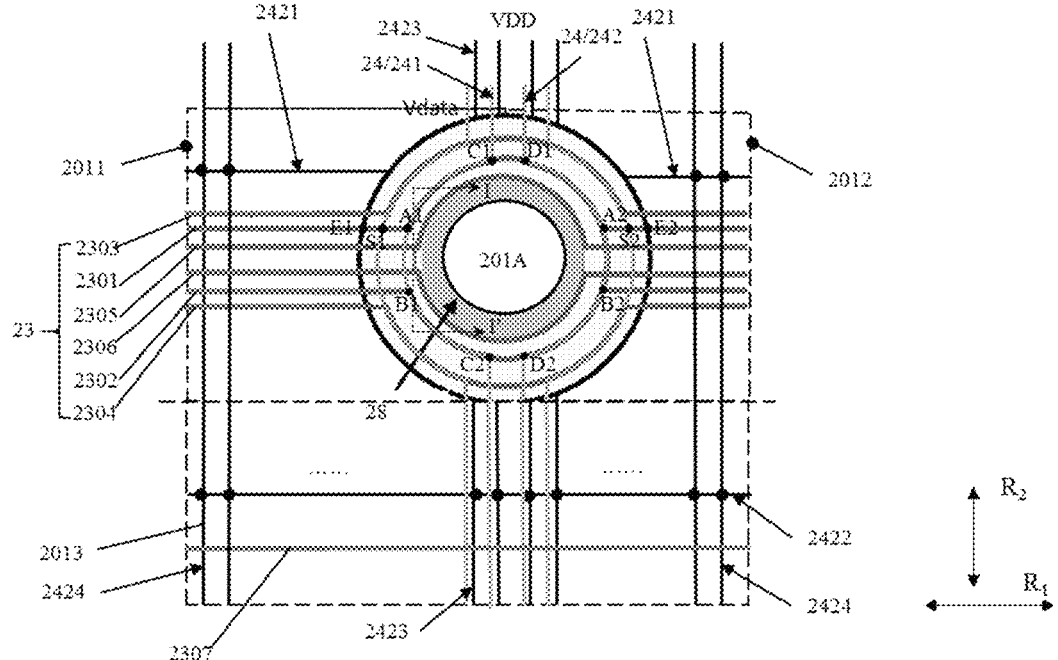
FIG. 2B is a partial enlarged schematic diagram of the first opening region in FIG. 2A.

FIG. 2A is a planar schematic diagram of a display substrate provided by an embodiment of the present disclosure; and FIG. 2B is a partial enlarged schematic diagram of the first opening region in FIG. 2A.

As illustrated in FIGS. 2A and 2B, the display substrate 20 includes a base substrate, a first signal line 23 and a second signal line 24. The base substrate includes a first opening region 202A, a display region 201 and a frame region 204. The first opening region 202A includes a first opening 201A and a first opening peripheral region 203A surrounding the first opening 201A; the display region 201 surrounds the first opening region 202A, and the frame region 204 surrounds the display region 201.

The display region 201 includes pixels arranged in an array, each of the pixels includes one or more sub-pixels, and the display region 201 further includes various signal lines configured to transmit various electrical signals to the sub-pixels, to achieve a display function; the frame region 204 includes various driving circuits, signal lines electrically connected to the sub-pixels, contact pads, etc., and the signal lines in the frame region 204 are electrically connected (or integral with) with the signal lines (such as gate lines, and data lines) in the display region 201 to provide electrical signals (such as scanning signals, and data signals) to the sub-pixels.

For example, the first opening 201A is arranged to allow light from a display side of the display substrate to pass through to reach a camera and a distance sensor, and to realize light sensing, so that the functions such as image shooting and distance sensing are realized; for example, in the region corresponding to the first opening 201A, devices such as a camera, and a distance sensor, can be arranged on a back side of the display substrate (that is, a side of the display substrate opposite to the display side), and the devices, such as the camera, and the distance sensor, and these devices listed above at least partially exposed through the first opening 201A.

For example, the various signal lines from the frame region 204 extend through the display region 201, in the case that these signal lines encounter the first opening region 201A, these signal lines pass through the first opening peripheral region 203A and bypass the first opening 201A, then enter the display region 201, to provide electrical signals (such as scanning signals, and data signals) to the sub-pixels passing by, in this way, these signal lines may not be arranged in the first opening 201A, so as to increase the light transmittance of the first opening 201A.

The display region 201 includes a first display region 2011 and a second display region 2012. The first display region 2011 is located on the first side of the first opening region 202A, the second display region 2012 is located on the second side of the first opening region 202A, and the first side and the second side are opposed to each other in the first direction R1 (the horizontal direction in the figure). For example, the first display region 2011, the first opening peripheral region 203A, and the second display region 2012 are sequentially arranged along the first direction R1. A whole of the first display region 2011 and the second display region 2012 includes a first pixel array. For example, the first pixel array includes a plurality of pixels arranged in an array, each of the pixels includes a plurality of sub-pixels, and each of the sub-pixels includes a pixel circuit.

Taking a first signal line 2301 in FIG. 2B as an example, for example, the display substrate includes a plurality of first signal lines 2301/2302/2303/2304/2305/2306, the first signal line 2301 is configured to provide a first display signal to the first pixel array, and the first signal line 2301 sequentially passes through the first display region 2011, the first opening peripheral region 203A, and the second display region 2012 along the first direction R1, so that the first signal line is electrically connected to the sub-pixels in the first display region 2011 and the second display region 2012 that are respectively located on two opposite sides of the first opening 201A, for example, the first signal line provides the first display signal to the sub-pixels of the plurality of the pixels in both the first display region 2011 and the second display region 2012 that are along a same horizontal line as the first opening peripheral region 203A. In each of the embodiments, the first display signal may be, for example, any form of electrical signal such as a gate scanning signal, a light-emitting control signal, or a reset voltage signal. For example, the plurality of first signal lines 2301/2302/2303/2304/2305/2306 provide one or more selected from a group consisting of scanning signal, light-emitting control signal, and reset voltage signal to the pixel circuits in both the first display region 2011 and the second display region 2012 of the display region.

Figure 2C:
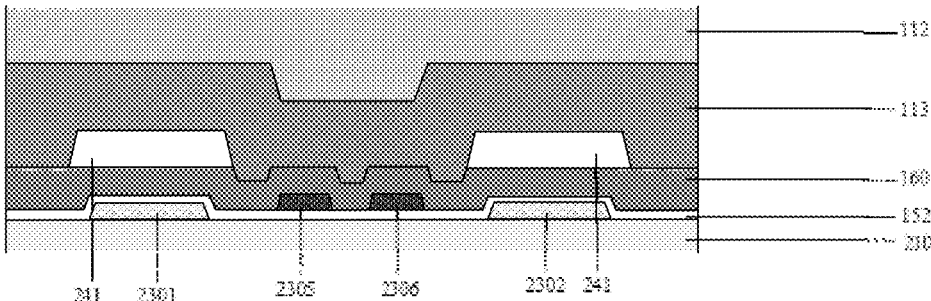
FIG. 2C is a cross-sectional schematic diagram taken along the line I-I' in FIG. 2B.

FIG. 2C is a cross-sectional schematic diagram taken along the line I-I' in FIG. 2B. Combining FIG. 2B and FIG. 2C, the first signal line 2301 includes a first lead line portion E1A1/E2A2 (that is, taking one first signal line as an example, for example, the first lead line portion includes a straight line segment E1A1 and a straight line segment E2A2 in FIG. 2B.) located in the first opening peripheral region 203A and a first winding line portion A1A2 (that is, the first winding line portion is a curved segment A1A2 in FIG. 2B) located in the first opening peripheral region 203A; and the first winding line portion A1A2 partially surrounds the first opening 201A. The second signal line 24 is configured to provide a second display signal to the first pixel array, the second signal line 24 passes through the first opening peripheral region 203A along a second direction R2 intersecting the first direction R1, and the second signal line 24 includes a second winding line portion C1C2 located in the peripheral region 203A of the first opening, that is, the second winding line portion is a curved segment C1C2 in FIG. 2B; the second winding line portion C1C2 partially surrounds the first opening 201A. An orthographic projection of the first lead line portion E1A1/E2A2 on the base substrate and an orthographic projection of the second signal line 24 on the base substrate respectively have a first overlapping region S1/S2, that is, an area where the two orthographic projections intersect with each other. An orthographic projection of the first winding line portion A1A2 on the base substrate and an orthographic projection of the second winding line portion C1C2 on the base substrate have a second overlapping region, for example, the two orthographic projections overlap with each other in the section A1C1 and the section D1A2, and the second overlapping region is the region represented by the section A1C1 and the section D1A2. In this way, because of the formation of the first overlapping region and the second overlapping region, a compensation capacitor is formed between the first signal line 2301 and the second signal line 24 that overlap each other in a direction perpendicular to the base substrate, the load on the first signal line is compensated, so that a display difference caused by different loads on the first signal lines connecting different rows of pixels due to the different numbers of pixels in the different rows of pixels in the first pixel array is reduced, a display effect of both the first display region 2011 and the second display region 2012 is consistent with a display effect of the pixel rows in the display region 201 where the first opening region 202A is not arranged, and the display quality is improved. Meanwhile, the above arrangement method of the signal lines can also reduce an arrangement space of the first signal line and the second signal line, and can reduce an area occupied by the first opening peripheral region 203A as much as possible. Therefore, for example, in the case that an under-screen camera function is realized through the first opening region 202A, the influence of the first opening region 202A on the display effect of the region around is reduced, or in other embodiments, in the case that the first opening peripheral region 203A is located in the frame region 204, a width of the frame region 204 can be reduced, which is beneficial to achieve a narrow frame and large-screen design of the display substrate 20. For example, as illustrated in FIG. 2B, the orthographic projection of the first lead line portion E1A1 of the first signal line 2301 on the base substrate and an orthographic projection of the second winding line portion of the second signal line 24 on the base substrate have the first overlapping region.

For example, the first lead line portions E1A1 of one same first signal line 2301 may form a plurality of the first overlapping regions respectively with a plurality of second signal lines 24, that is, the first lead line portions E1A1 of one same first signal line 2301 may cross a plurality of second signal lines 24, the compensation capacitor formed by the first overlapping regions is increased to a greater extent, and the load of the first signal line 2301 is increased to a greater extent.

It should be noted that, in the embodiments of the present disclosure, for example, as illustrated in FIG. 2B, the second overlapping region is provided with components in both the first direction R1 and in the second direction R2, that is, the second overlapping region not only extends in the first direction, but also extends in the second direction. Therefore, compared with the case where linear signal lines that only extend in the first direction R1 and overlap with each other, or compared with the case where the linear signal lines that only extend in the second direction R2 and overlap with each other, the embodiments of the present disclosure can make full use of the space in the first opening peripheral region of the first opening to meet a requirement of a compensation capacitor with a larger range, and an amplitude of the compensation capacitor formed by the second overlapping region can be enlarged.

For example, the first winding line portion A1A2 extends from the first side of the first opening 201A, surrounding the first opening 201A, to the second side of the first opening 201A, the first side of the first opening 201A and the second side of the first opening 201A are opposite to each other in the first direction R1; the second winding line portion C1C2 extends from the third side of the first opening 201A, surrounding the first opening 201A, to the fourth side of the first opening 201A, and the third side of the first opening 201A and the fourth side of the first opening 201A are opposite to each other in the second direction R2.

For example, in the embodiments illustrated the above figures, a planar shape of the first winding line portion A1A2 and a planar shape of the second winding line portion C1C2 respectively constitute a part of a concentric ring of a planar shape of the first opening 201A. For example, the planar shape of the first opening 201A is circular, the planar shape of the first winding line portion A1A2 and the planar shape of the second winding line portion C1C2 respectively constitute a part of a concentric ring of the planar shape of the first opening 201A. In this case, both the planar shape of the first winding line portion A1A2 and the planar shape of the second winding line portion C1C2 are circular arcs, that is, the planar shape of the first winding line portion and the planar shape of the second winding line portion respectively include a circular arc shape. In this way, the shapes of both the first winding line portion A1A2 and the second winding line portion C1C2 match the shapes of both the first opening 201A and the first opening peripheral region 203A, this design makes full use of the area of the first opening peripheral region 203A, so as to reduce the area occupied by the first opening peripheral region 203A, and to reduce the area of the display region occupied by the first opening region 202A, for example, in the case that the under-screen camera function is implemented through the first opening region 202A, the negative effect of the first opening region 202A on the display effect of the area can be reduced.

For example, in some embodiments, the first display region 2011 and the second display region 2012 include a plurality of rows of pixels separated by the first opening region 202A, and the plurality of rows of the pixels in the first display region 2011 correspond to the plurality of rows of pixels in the second display region 2012 in a one-to-one manner. For example, the pixels of the n-th row (n is a positive integer) of the first display region 2011 correspond to the pixels of the n-th row of the second display region 2012, these pixels are located in a same row from the perspective of the display effect, so that these pixels are regarded as a same row of pixels in the display region 201 in the present disclosure.

Figure 2D:
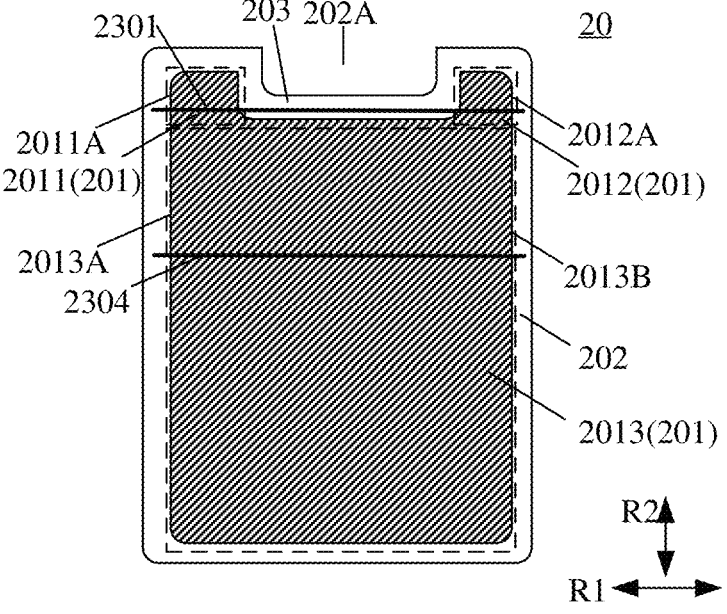
FIG. 2D is a planar schematic diagram of another display substrate provided by at least one embodiment of the present disclosure.
Figure 2E:
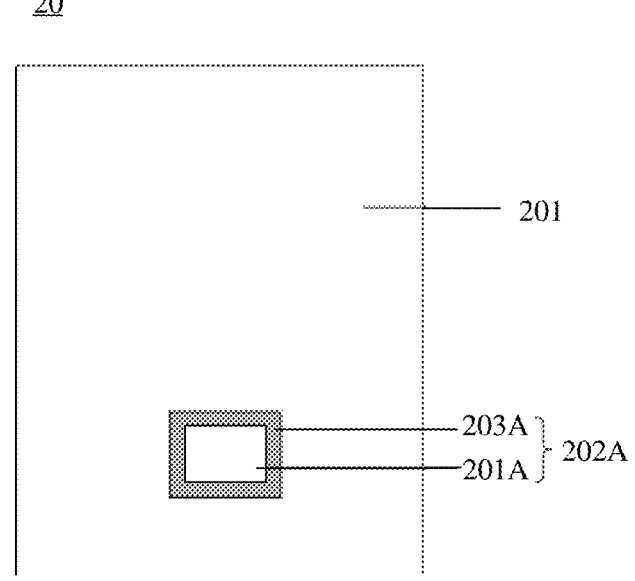
FIG. 2E is a planar schematic diagram of still another display substrate provided by at least one embodiment of the present disclosure.
Figure 2F:
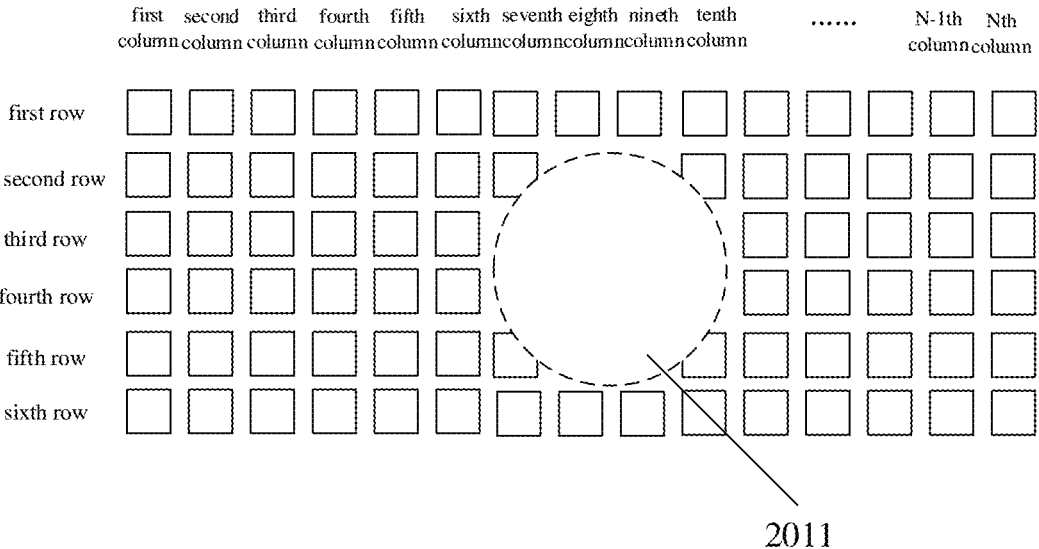
FIG. 2F is a planar schematic diagram of an arrangement of pixels near the first opening region of the display substrate according to at least one embodiment of the present disclosure.

For example, the first pixel array includes a first pixel row and a second pixel row respectively extending along the first direction R1, the first pixel row and the second pixel row are arranged in the second direction R2, and both the first pixel row and the second pixel row are disconnected by the first opening region 202A. For example, FIG. 2F shows a planar schematic diagram of an arrangement of pixels near the first opening region 2011. For example, in some examples, as illustrated in FIG. 2F, assuming that a first row and a sixth row are rows full of pixels, a second row to a fifth row are pixel rows on both sides of the first opening region 2011 in FIG. 2B, which are rows that are not full of pixels. As illustrated in FIG. 2B, the display substrate 20 includes a plurality of first signal lines 23, the plurality of the first signal lines 23 include a first signal line 2301 configured to provide a first display signal to a first pixel row and a first signal line 2302 configured to provide a first display signal to a second pixel row. For example, the first pixel row and the second pixel row are two adjacent pixel rows, for example, the second row and the third row respectively illustrated in FIG. 2F; for another example, the first pixel row and the second pixel row are two non-adjacent pixel rows which are, for example, respectively the second row and the fourth row illustrated in FIG. 2F. For example, the first signal line 2301 and the first signal line 2302 are in a same layer. The first winding line portion A1A2 of the first signal line 2301 protrudes toward the third side of the first opening 201A and partially surrounds the first opening 201A on the third side of the first opening 201A. The first winding line portion B1B2 of the first signal line 2302 protrudes toward the fourth side of the first opening 201A and partially surrounds the first opening 201A on the fourth side of the first opening 201A. In this way, the first signal line 2301 provides the first display signal for the first pixel row along the first direction R1 in the first display region 2011 and the second display region 2012. The first signal line 2302 provides a first display signal for the second pixel row along the first direction R1 in the first display region 2011 and the second display region 2012. For example, the first signal line 2301 and the first signal line 2302 are gate scanning signal lines, correspondingly, the first display signal is a gate scanning signal. In this case, the first signal line 2301 and the first signal line 2302 are gate scanning signal lines (can also be referred to as a gate line for short) that provide gate scanning signals to different pixel rows in the first display region 2011 and the second display region 2012.

For example, one second signal line 24 in the figure at least partially overlaps with two different first signal lines in a direction perpendicular to the base substrate, and the two first signal lines respectively provide first display signals to two different pixel rows of the first pixel array. For example, an orthographic projection of the first winding line portion B1B2 of the first signal line 2302 partially overlaps with an orthographic projection of the second winding line portion C1C2 of the second signal line 24 on the base substrate, for example, the two orthographic projections overlap in the segment A1C1 and the segment B1C2. In this way, a compensation capacitor is formed between the first signal line 2302 and the second signal line 24 that overlapped with each other in the direction perpendicular to the base substrate, and the load on the first signal line 2302 is compensated.

For example, the first pixel array includes a first pixel column and a second pixel column respectively extending along the second direction R2, and the first pixel column and the second pixel column are arranged in the first direction R1. The display substrate 20 includes a plurality of second signal lines 24, the plurality of second signal lines 24 include the second signal lines 241 configured to provide a second display signal to the first pixel column and the second signal lines 242 configured to provide the second display signal to the second pixel column. For example, in some examples, as illustrated in FIG. 2F, the first pixel column and the second pixel column are two adjacent pixel columns, for example, the seventh column and the eighth row respectively illustrated in FIG. 2F; for another example, the first pixel column and the second pixel column are two non-adjacent pixel columns, for example, the seventh column and the ninth column respectively illustrated in FIG. 2F. The second winding line portion C1C2 of the second signal line 241 protrudes toward the first side of the first opening 201A and partially surrounds the first opening 201A on the first side of the first opening 201A; the second winding line portion D1D2 of the second signal line 242 protrudes toward the second side of the first opening 201A and partially surrounds the first opening 201A on the second side of the first opening 201A, to avoid affecting the light transmittance of the first opening 201A.

It should be noted that, FIG. 2F is only exemplary, the number of the pixel rows and the number of the pixel columns in the embodiment of the present disclosure is not limited to the number illustrated in FIG. 2F.

For example, the first winding line portion A1A2 of the first signal line 2301 and the first winding line portion B1B2 of the first signal line 2302 are substantially symmetrical with respect to a symmetry axis along the first direction R1. The second winding line portion C1C2 of the second signal line 241 and the second winding line portion D1D2 of the second signal line 242 are substantially symmetrical with respect to a symmetry axis along the second direction R2. In this way, the shapes of both the first winding line portion A1A2 and the second winding line portion C1C2 match the shapes of both the first opening 201A and the first opening peripheral region 203A, this design makes full use of the area of the first opening peripheral region 203A, so as to reduce the area occupied by the first opening peripheral region 203A, and to reduce the area of the display region occupied by the first opening region 202A, for example, in the case that the under-screen camera function is implemented through the first opening region 202A, the negative effect of the first opening region 202A on the display effect of the area can be reduced.

Of course, in some other embodiments, the first winding line portion A1A2 of the first signal line 2301 and the first winding line portion B1B2 of the first signal line 2302 may not be symmetrical with respect to the symmetry axis along the first direction R1; and the second winding line portion C1C2 of the second signal line 241 and the second winding line portion D1D2 of the second signal line 242 may not be substantially symmetrical with respect to the symmetry axis along the second direction R2.

Similar to the first signal line 2301 and the first signal line 2302, the first signal line 2303 and the first signal line 2304 are also like this. It should be understood that, the embodiment only takes the first signal line and the second signal line as an example, and the embodiment is not limited to only the first signal line and the second signal line illustrated in FIG. 2B.

For example, as illustrated in FIGS. 2A and 2B, the display substrate 20 further includes a third display region 2013. For example, the third display region 2013 includes a first part 2013C located on the first side of a whole of the first display region 2011 and the second display region 2012 in the second direction R2, and includes a second part 2013D located on a whole of the second side of the first display region 2011 and the second display region 2012 in the second direction R2, the first side of a whole of the first display region 2011 and the second display region 2012 and the second side of a whole of the first display region 2011 and the second display region 2012 are opposite to each other in the second direction R2; both the first part 2013C and the second part 2013D are connected to the first display region 2011 and the second display region 2012, that is, edges of the both first part 2013C and the second part 2013D close to the first display region 2011 is connected to the respective edges of the first display region 2011).

For example, two edges 2013A and 2013B of the first part 2013C of the third display region 2013 that are opposite to each other in the second direction R2, are respectively aligned with the edge 2011A of the first display region 2011 which extends in the second direction R2 and is away from the first opening 201A, and the edge 2012A of the second display region 201 which extends in the second direction R2 and is away from the first opening 201A. The third display region 2013 includes a second pixel array, and the second pixel array includes pixels arranged in multiple rows and multiple columns. The display substrate 20 further includes a plurality of third signal lines 2307, and the plurality of third signal lines 2307 are located in the first part 2013C and the second part 2013D of the third display region 2013. FIG. 2A and FIG. 2B show a third signal line 2307 located in the first part 2031A of the third display region 2013 as an example. The third signal lines 2307 are configured to respectively provide third scanning signals to the pixels in the rows of the second pixel array and extend along the first direction R1; for example, in the embodiment, the second signal line 24 sequentially passes through the second part 2013D of the third display region 2013, the first opening peripheral region 203A, and the first part 2013C of the third display region 2013 along the second direction R2, and is configured to provide the second display signal for the pixels in the multiple columns of the second pixel array.

The third display region 2013 also includes a plurality of pixels, each of the pixels includes a plurality of sub-pixels, each of the sub-pixels includes a pixel circuit. Each of the pixels in the third display region 2013 may be provided with a same structure as each of the pixels of both the first display region and the second display region. For example, in some embodiments, the numbers of pixels included in each row of pixels in multiple rows and multiple columns of sub-pixels in the third display region 2013 are substantially the same. In this case, the numbers of the pixels respectively electrically connected to the plurality of third signal lines 2307 are substantially the same, so that the plurality of the third signal lines 2307 are provided with substantially the same load. For example, the number of the pixels included in each row of pixels in multiple rows and multiple columns is more than the number of pixels included in the first pixel row of the first pixel array, and is more than the number of the pixels included in the second pixel row of the first pixel array. For example, the load of each of the first signal lines 2301/2302/2303/2304 after load compensation is basically the same as the load of each of the plurality of the third signal lines 2307, furthermore, the transmission speeds of each of first signal lines 2301/2302/2303/2304 and each of the third signal lines 2307 are basically the same, a deviation between an actual display signal transmitted to the pixel circuit of the sub-pixel and a design value is basically the same, in this way, the display consistency of the display region 201 can be maintained, and the display effect of the display substrate 20 can be improved.

For example, as illustrated in FIG. 2B, the second signal lines 24 are data lines, and are configured to provide data signals for the sub-pixels for controlling a light-emitting gray value of the sub-pixel.

As illustrated in FIG. 2B, for example, the display substrate 20 further includes a first power line VDD, the first power line VDD is connected to a first voltage terminal, and is configured to provide a first power voltage to the pixel circuits of one or more sub-pixels. For example, the first power line VDD includes a plurality of first sub-wirings 2421/2422 extending in the first direction R1 and a plurality of second sub-wirings 2423/2424 extending in the second direction R2. A first part of first sub-wirings 2421 among the plurality of the first sub-wirings 2421/2422 are disconnected (broken) at the first opening region 202A, and a second part of the first sub-wirings 2422 among the plurality of first sub-wirings 2421/2422 passes through the third display region. For example, in FIG. 2B, the first sub-wirings 2422 passes through the first part 2013C of the third display region 2013 along the first direction R1. The first part of second sub-wirings 2423 among the plurality of second sub-wiring lines 2423/2424 are disconnected (broken) in the first opening region 202A, the second part of second sub-wirings 2424 among the plurality of second sub-wiring 2423/2424 sequentially passes through the first display region 2011 and the third display region 2013, for example, in the embodiment, sequentially passes through the second part 2013D of the third display region 2013, the first display region 2011 and the first part 2013C of the third display region 2013. Or, the second sub-wirings 2424 sequentially pass through the second display region 2012 and the third display region 2013, for example, in the embodiment, sequentially pass through the second part 2013D of the third display region 2013, the second display region 2012 and the first part 2013C of the third display region 2013. The first part of first sub-wirings 2421 are electrically connected to at least one second sub-wiring of the second part of second sub-wirings 2424 respectively in the first display region 2011 and the second display region 2012, and the first part of the second sub-wiring 2423 are electrically connected to at least one first sub-wiring 2422 of the first sub-wirings 2422 of the second part in the third display region 2013, to provide the first power supply voltage for the sub-pixels in each row and each column of both the first pixel array and the second pixel array.

A planar shape of the first opening region of the display substrate provided by at least one embodiment of the present disclosure is not limited to a circle, for example, the planar shape may also be a regular pattern such as a rectangle and an ellipse, or an irregular pattern such as a racetrack shape and a drop shape. In these cases, the arrangement principles and the technical effects of the first signal line and the second signal line are the same as or similar to those of the above example where the planar shape of the first opening region is a circle.

In the embodiment of the present disclosure, the first opening region is not limited to being completely surrounded by the display region. For example, FIG. 2D is a planar schematic diagram of another display substrate according to at least one embodiment of the present disclosure. In the embodiment illustrated in FIG. 2D, the first opening region 202A is similar to a rectangular groove. The first opening region 202A is located at one end of the display region 201, no display region is provided on an upper side of the first opening region 202A, and the display region 201 partially surrounds the first opening region 202A. For another example, in the embodiment illustrated in FIG. 2E, the first opening region 202A is located at a position lower than the middle of the entire display substrate, for example, a photoelectric conversion device is arranged in the first opening 201A for fingerprint identification; in addition, the planar shape of the first opening region 202A and the planar shape of the first opening 201A are respectively rectangular, and the planar shape of the first opening peripheral region 203A is a rectangular ring surrounding the rectangle. For example, in the first opening peripheral region 203A, a distribution of planar shapes of both a bent part of the first signal line and a bent part of the second signal line constitutes a part of a rectangular ring surrounding the rectangle, for example, the rectangular ring is a concentric ring of the rectangle.

The above embodiments are only exemplary, the present disclosure does not limit the planar shape and the arrangement position of the first opening region 202A, which can be designed according to requirements.

Figure 3A:
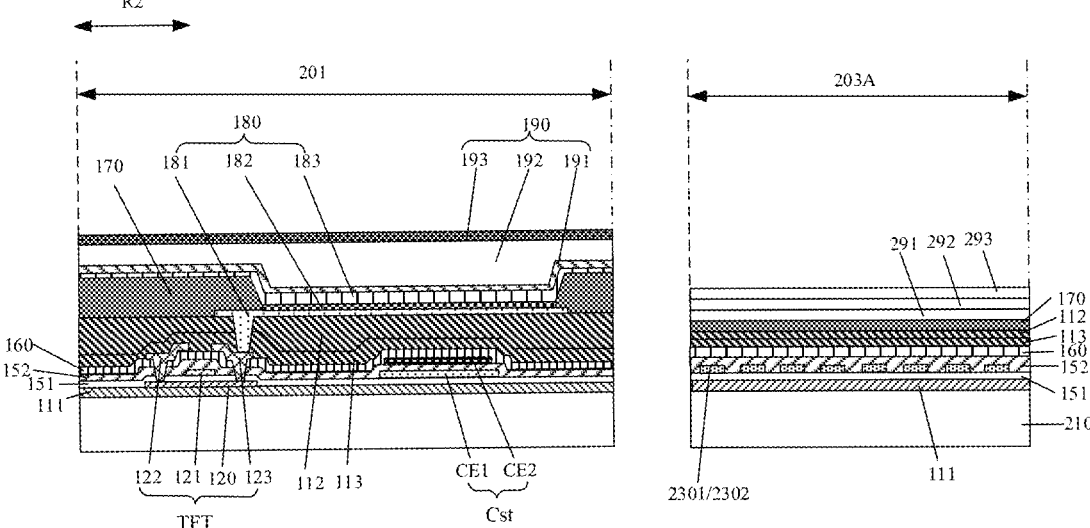
FIG. 3A is a cross-sectional schematic diagram of a display region of the display substrate in FIG. 2A taken along the line A-A'.
Figure 3B:
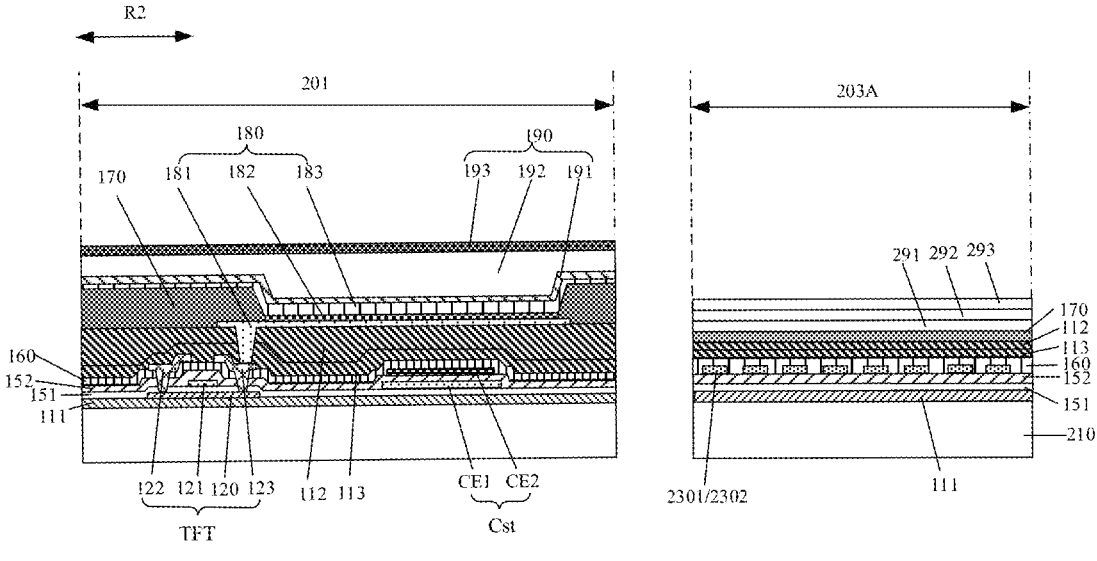
FIG. 3B is another cross-sectional schematic diagram of the display region of the display substrate in FIG. 2A taken along the line A-A'.

FIG. 3A is a cross-sectional schematic diagram of a display region of the display substrate in FIG. 2A taken along a line A-A', and FIG. 3B is another cross-sectional schematic diagram of the display region of the display substrate in FIG. 2A taken along the line A-A'.

As illustrated in FIG. 3A, the pixel circuit of each of the sub-pixels in the display region 201 of the display substrate 20 includes a transistor, which is described by taking a thin film transistor (TFT) as an example, a light-emitting element 180 and a storage capacitor Cst. The thin film transistor includes an active layer 120, a gate electrode 121, and a source electrode and a drain electrode 122/123; the storage capacitor Cst includes a first electrode plate CE1 and a second capacitor electrode plate CE2. The light-emitting element 180 includes a cathode 183, an anode 181, and a light-emitting layer 182 between the cathode 183 and the anode 181, the anode 181 is electrically connected to one of the source electrode and the drain electrode 122/123 of the thin film transistor TFT, such as the drain electrode 123. For example, the light-emitting element may be, for example, an organic light-emitting diode (OLED) or a quantum dot light-emitting diode (QLED), and correspondingly, the light-emitting layer 182 is an organic light-emitting layer or a quantum dot light-emitting layer.

For example, the gate electrode 121, the entire first signal line 2301 and the first electrode plate CE1 of the storage capacitor Cst are arranged in a same layer. Or, in the embodiment illustrated in FIG. 3B, a part of the first signal line 2301/2032 located in the first opening peripheral region 203A illustrated in FIG. 2B and a part of the first signal line 2301/2032 located in both the first display region 2011 and the second display region 2012 are arranged in different layers (that is, arranged in different layers as the gate electrode 121 and the first electrode plate CE1 of the storage capacitor Cst). In this case, the part of the first signal line 2301/2032 located in the first opening peripheral region 203A is electrically connected to the part of the first signal line 2301/2032 located in both the first display region 2011 and the second display region 2012 through a via hole. For example, the gate electrode 121, the part of the first signal line 2301/2032 located in both the first display region 2011 and the second display region 2012, and the first electrode plate CE1 of the storage capacitor Cst are in a same layer; the part of the first signal line 2301/2032 located in the peripheral region 203A of the first opening and the second electrode plate CE2 of the storage capacitor Cst are in a same layer. The structure arranged in the same layer can be formed by one patterning process, thereby simplifying the manufacturing process of the display substrate 20. The other structures of the embodiment illustrated in FIG. 3B are the same as those in FIG. 3A, please refer to the descriptions of FIG. 3A.

For example, as illustrated in FIG. 3A, the display region 201 further includes a first gate insulation layer 151 located between the active layer 120 and the gate electrode 121, a second gate insulation layer 152 and an interlayer insulation layer 160 located above the gate electrode 121. The second gate insulation layer 152 is located between the first electrode plate CE1 and the second capacitor electrode plate CE2, so that the first electrode plate CE1, the second gate insulation layer 152, and the second capacitor electrode plate CE2 constitute a storage capacitor Cst. The interlayer insulation layer 160 covers the second capacitor electrode plate CE2.

For example, as illustrated in FIG. 3A, the display region 201 further includes an insulation layer 113 (for example, a passivation layer) covering the pixel circuit and a first planarization layer 112. The display region 201 further includes structures such as a pixel definition layer 170 for defining a plurality of sub-pixels, and spacers (not illustrated) on the pixel definition layer 170. As illustrated in FIG. 3A, in some embodiments, the insulation layer 113 is located above the source and drain electrodes 122/123 (for example, a passivation layer made of materials such as silicon oxide, silicon nitride or silicon oxynitride), a first planarization layer 112 is arranged above the insulation layer 113, and the anode 181 is electrically connected to the drain electrode 123 through a via hole penetrating both the first planarization layer 112 and the insulation layer 113.

For example, as illustrated in FIG. 3A, the first opening peripheral region 203A of the display substrate 20 further includes encapsulation layers 291, 292, and 293. The display region 201 further includes an encapsulation layer 190, and the encapsulation layer 190 includes a plurality of encapsulation sub-layers 191/192/193. Of course, the number of the encapsulation layer 190 is not limited to including three sub-layers, and may also include two, or four, five or more sub-layers. For example, the first encapsulation layer 291 and the first encapsulation sub-layer 191 in the encapsulation layer 190 are arranged in a same layer, the second encapsulation layer 292 and the second encapsulation sub-layer 192 in the encapsulation layer 190 are arranged in a same layer, the third encapsulation layer 293 and the third encapsulation sub-layer 193 in the encapsulation layer 190 are arranged in a same layer, for example, both the first encapsulation layer 291 and the third encapsulation layer 293 include inorganic encapsulation materials, for example, include silicon oxide, silicon nitride, or silicon oxynitride, the second encapsulation layer 292 may include an organic material, for example, include a resin material. The encapsulation structure including a plurality of layers in the display region 201 and the first opening peripheral region 203A can achieve a better packaging effect, to prevent impurities such as water vapor or oxygen from penetrating into the display substrate 20.

In some embodiments, as illustrated in FIG. 3A, the display substrate further includes a buffer layer 111 on the base substrate 210, and the buffer layer 111 serves as a transition layer which can prevent harmful substances in the base substrate 210 from intruding into the interior of the display substrate 20, and can increase the adhesion of the film in the display substrate 20 on the base substrate 210. For example, the material of the buffer layer 111 includes a single-layer structure or multi-layer structure formed of insulation materials such as silicon oxide, silicon nitride, and silicon oxynitride.

Figure 3C:
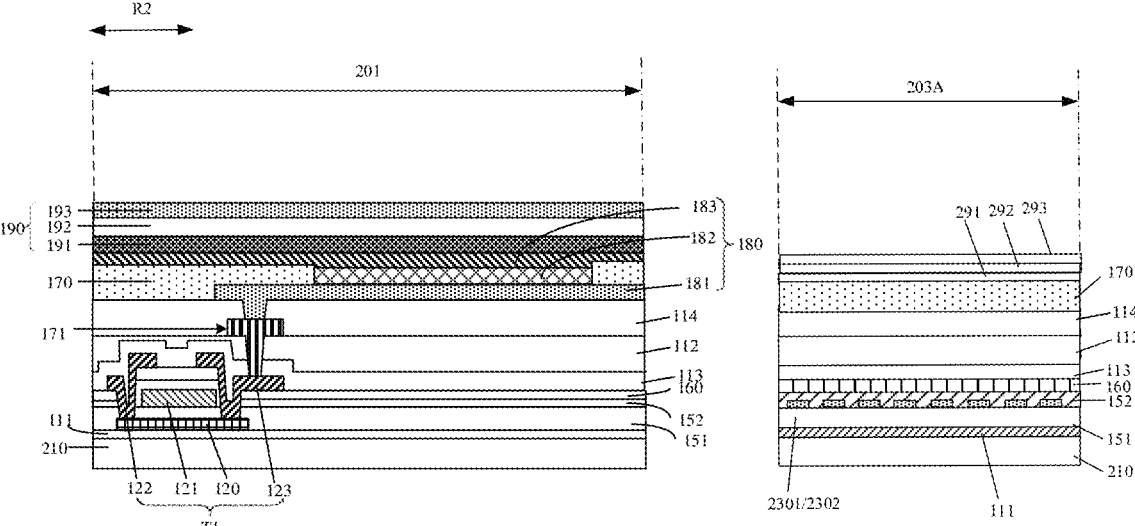
FIG. 3C is still another cross-sectional schematic diagram of the display region of the display substrate in FIG. 2A taken along the line A-A'.

FIG. 3C is still another cross-sectional schematic diagram of the display region of the display substrate in FIG. 2A taken along the line A-A', and FIG. 3C only shows a partial cross-sectional schematic diagram of the display region. A difference from the display region illustrated in FIG. 3A is that in the display region illustrated in FIG. 3C, the anode 181 of the light-emitting element 180 is electrically connected to the drain electrode 123 of the thin film transistor TFT through a transfer electrode 171. In this case, the transfer electrode 171 is covered with a second planarization layer 114, for example, the second planarization layer 114 is covered on the first planarization layer 112. The second planarization layer 114 in the cross-sectional schematic diagram of the display region 201 on the left in FIG. 3C extends into the first opening peripheral region 203A, so that a structure as illustrated in the cross-sectional schematic diagram of the first opening peripheral region 203A on the right side in FIG. 3C is formed.

For example, in other embodiments, the display region of the display substrate may not be provided with the insulation layer 113 and the second planarization layer 114.

For example, in at least one embodiment of the present disclosure, the base substrate 210 is a glass substrate, a quartz substrate, a metal substrate, or a resin substrate. For example, a material of the base substrate 210 includes organic materials, for example, the organic materials can be resin materials such as polyimide, polycarbonate, polyacrylate, polyetherimide, polyethersulfone, polyethylene terephthalate, and polyethylene naphthalate. For example, the base substrate 210 is a flexible substrate or a non-flexible substrate, which is not limited in the embodiment of the present disclosure.

For example, the material of any one selected from a group consisting of the first gate insulation layer 151, the second gate insulation layer 152, the interlayer insulation layer 160, the first planarization layer 112, the pixel definition layer 170, and the spacers may include an inorganic insulation material such as silicon oxide, silicon nitride, or silicon oxynitride, or may include an organic insulation materials such as polyimide, polyphthalimide, polyphthalamide, acrylic resin, benzocyclobutene, or phenol resin. The embodiments of the present disclosure do not specifically limit the materials of the first gate insulation layer 151, the second gate insulation layer 152, the interlayer insulation layer 160, the first planarization layer 112, the pixel definition layer 170 and the spacers. For example, the materials of the first gate insulation layer 151, the second gate insulation layer 152, the interlayer insulation layer 160, the first planarization layer 112, the second planarization layer 114, the pixel definition layer 170, and the spacers can be the same or partly the same as each other, or can be different from each other, which are not limited in the embodiments of the present disclosure.

For example, as illustrated in FIG. 2B, the display substrate 20 may further include a barrier wall 28 which is in the first opening peripheral region 203A and at least partially surrounds the first opening 201A. For example, in a direction perpendicular to the base substrate 210, the barrier wall 28 at least partially overlaps with the first signal line and the second signal line. The barrier wall 28 can play functions of barrier and support in the first opening peripheral region 203A, to maintain the stability of the first opening 201A and protect a photoelectric sensor component such as a camera in the first opening 201A, at the same time, the barrier wall 28 can prevent harmful impurities such as moisture and oxygen from diffusing into the display region through the first opening 201A, so that a deterioration of the pixel circuit in the display region caused by harmful impurities can be prevented.

Figure 4:
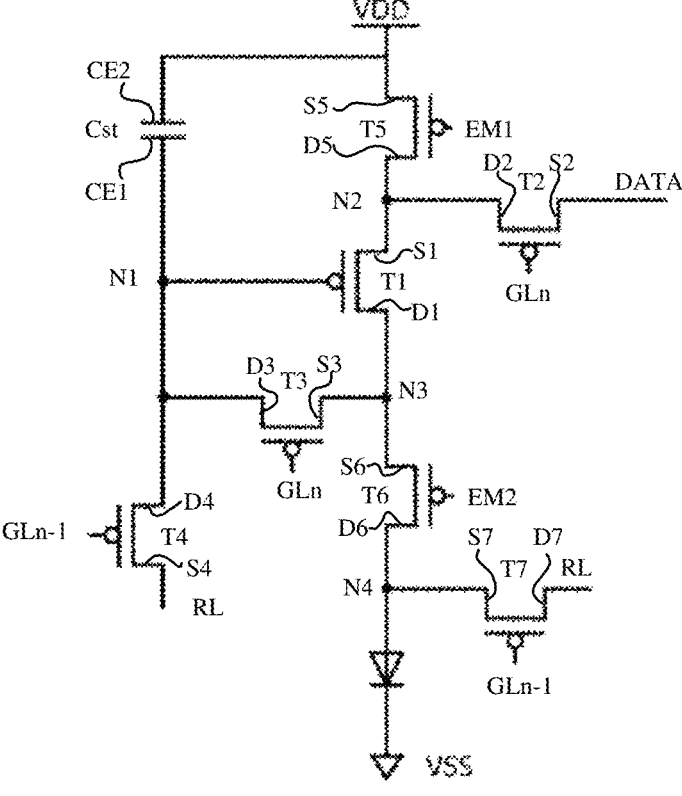
FIG. 4 is an equivalent circuit diagram of a pixel circuit in the display substrate provided by at least one embodiment of the present disclosure.

FIG. 4 is an equivalent circuit diagram of a pixel circuit in the display substrate provided by at least one embodiment of the present disclosure; FIGS. 5A to 5F are schematic diagrams of each layer of the pixel circuit of the display substrate provided by at least one embodiment of the present disclosure.

In some embodiments, as illustrated in FIG. 4, the pixel circuit includes a plurality of thin film transistors: a first transistor T1, a second transistor T2, a third transistor T3, a fourth transistor T4, a fifth transistor T5, a sixth transistor T6, and a seventh transistor T7, a plurality of signal lines connected to the plurality of thin film transistors T1, T2, T3, T4, T5, T6, and T7, and a storage capacitor Cst, that is, the pixel circuit in the embodiment is a 7T1C structure. Correspondingly, the plurality of signal lines include gate lines GLn/GLn−1 (for example, scanning signal lines), light-emitting control lines EM, initialization lines RL, data lines DATA and first power lines VDD. The gate line GLn/GLn−1 may include a first gate line GLn and a second gate line GLn−1. For example, the first gate line GLn is configured to transmit a gate scanning signal, and the second gate line GLn−1 is configured to transmit a reset voltage signal, and the light-emitting control line EM is configured to transmit the light-emitting control signal, for example, the first gate line GLn and the second gate line GLn−1 are connected to the first light-emitting control terminal EM1 (in the following, the first light-emitting control line EM1 refers to a signal line connected to the first light-emitting control terminal EM1 and configured to provide the first light-emitting control signal to the first light-emitting control terminal EM1) and the second light-emitting control terminal EM2 (in the following, the second light-emitting control line EM2 refers to a signal line connected to the second light-emitting control terminal EM2 and configured to provide a second light-emitting control signal to the second light-emitting control terminal EM2). The gate electrode of the fifth transistor T5 is connected to the first light-emitting control terminal EM1, or serves as the first light-emitting control terminal EM1 to receive the first light-emitting control signal; the gate electrode of the sixth transistor T6 is connected to the second light-emitting control terminal EM2, or serves as the second light-emitting control terminal EM2 to receive the second light-emitting control signal. For example, the above-mentioned first signal line is the gate line GLn/GLn−1 (that is, a gate scanning signal line), and correspondingly, the first display signal is a gate scanning signal.

For example, in the display substrate provided by some embodiments of the present disclosure, the first signal line 23 may further include a light-emitting control line connected to the light-emitting control terminal. For example, in some embodiments of the present disclosure, the first signal line 2305/2306 illustrated in FIG. 2B may be connected to the first light-emitting control terminal EM1 or the second light-emitting control terminal EM2, the first light-emitting control terminal EM1 or the second light-emitting control terminal EM2 at least partially overlaps with the second signal line, so that the load of the first light-emitting control terminal EM1 or the second light-emitting control terminal EM2 is compensated, and the display uniformity of the entire display region 201 is improved.

It should be noted that, the embodiments of the present disclosure include, but are not limited to, the above-mentioned pixel circuit of the 7T1C structure, the pixel circuit can also adopt other types of circuit structures, such as a 7T2C structure or a 9T2C structure, etc., which are not limited in the embodiments of the present disclosure.

For example, as illustrated in FIG. 4, the first gate electrode of the first thin film transistor T1 is electrically connected to the third drain electrode D3 of the third thin film transistor T3 and the fourth drain electrode D4 of the fourth thin film transistor T4. The first source S1 of the first thin film transistor T1 is electrically connected to the second drain electrode D2 of the second thin film transistor T2 and the fifth drain D5 of the fifth thin film transistor T5. The first drain electrode D1 of the first thin film transistor T1 is electrically connected to the third source electrode S3 of the third thin film transistor T3 and the sixth source electrode S6 of the sixth thin film transistor T6.

For example, as illustrated in FIG. 4, the second gate electrode of the second thin film transistor T2 is configured to be electrically connected to the first gate line GLn, to receive a gate scanning signal; the second source electrode S2 of the second thin film transistor T2 is configured to be electrically connected to the data line DATA, to receive a data signal; and the second drain electrode D2 of the second thin film transistor T2 is electrically connected to the first source electrode S1 of the first thin film transistor T1.

For example, as illustrated in FIG. 4, the third gate electrode of the third thin film transistor T3 is configured to be electrically connected with the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode of the first thin film transistor T1.

For example, as illustrated in FIG. 4, the fourth gate electrode of the fourth thin film transistor T4 is configured to be electrically connected to the second gate line GLn−1 to receive a reset voltage signal, the fourth source electrode S4 of the fourth thin film transistor T4 is configured to be electrically connected to a initialization line RL to receive an initialization voltage signal, and the fourth drain electrode D4 of the fourth thin film transistor T4 is electrically connected to the first gate electrode of the first thin film transistor T1.

For example, as illustrated in FIG. 4, the fifth gate electrode of the fifth thin film transistor T5 is configured to be electrically connected to the light-emitting control line EM to receive a light-emitting control signal, the fifth source electrode S5 of the fifth thin film transistor T5 is configured to be electrically connected to the first power line VDD to receive a first power signal, and the fifth drain electrode D5 of the fifth thin film transistor T5 is electrically connected to the first source electrode S1 of the first thin film transistor T1.

For example, as illustrated in FIG. 4, the sixth gate electrode of the sixth thin film transistor T6 is configured to be electrically connected to the light-emitting control line EM to receive a light-emitting control signal, the sixth source electrode S6 of the sixth thin film transistor T6 is electrically connected to the first drain electrode D1 of the first thin film transistor T1, and the sixth drain electrode D6 of the sixth thin film transistor T6 is electrically connected to the first display electrode (for example, the anode) of the light-emitting element 180. The thin film transistors TFT in FIG. 3A to FIG. 3C are the sixth thin film transistor T6.

For example, as illustrated in FIG. 4, the seventh gate electrode of the seventh thin film transistor T7 is configured to be electrically connected to the second gate line GLn−1 to receive a reset voltage signal, the seventh source electrode S7 of the seventh thin film transistor T7 is electrically connected to a first display electrode (for example, the anode 181) of the light-emitting element 180, and the seventh drain electrode D7 of the seventh thin film transistor T7 is configured to be electrically connected to the initialization line RL to receive an initialization voltage signal. For example, the seventh drain electrode D7 of the seventh thin film transistor T7 is electrically connected to the initialization line RL by the fourth source electrode S4 connected to the fourth thin film transistor T4.

Figure 5A:
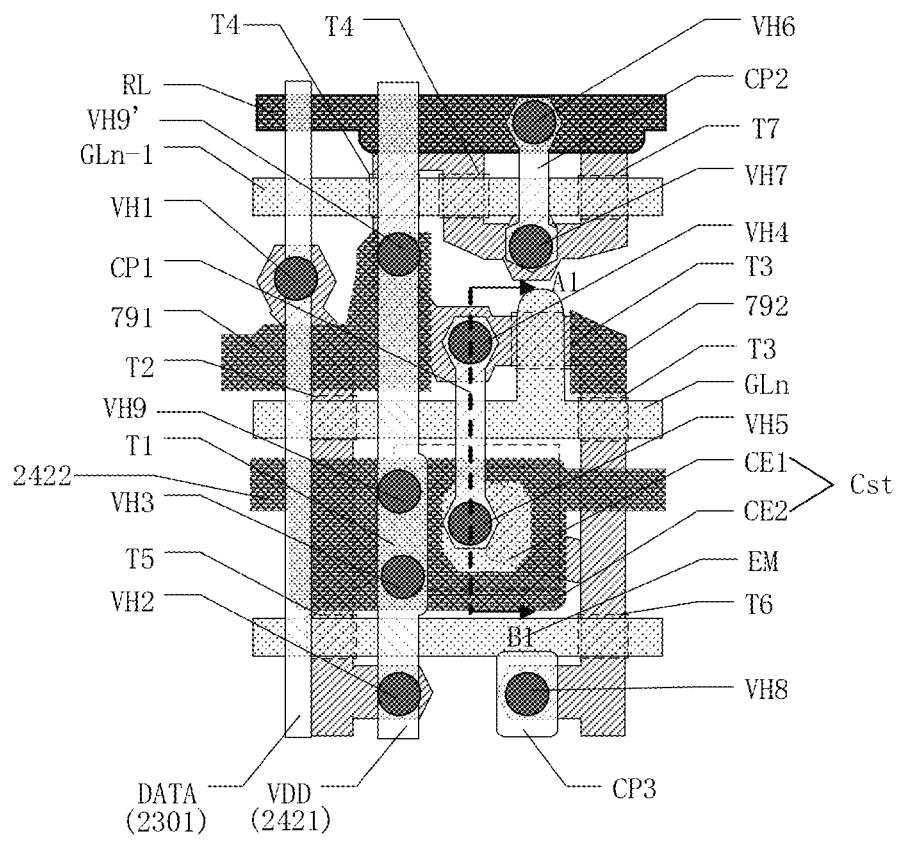
FIG. 5A is a schematic diagram of a planar layout of the pixel circuit in the display substrate provided by at least one embodiment of the present disclosure.

For example, as illustrated in FIG. 4 and FIG. 5A, the storage capacitor Cst includes the first electrode plate CE1 and the second electrode plate CE2. The second electrode plate CE2 is electrically connected to the first power line VDD, and the first electrode plate CE1 is electrically connected to the first gate electrode of the first thin film transistor T1 and the third drain electrode D3 of the third thin film transistor T3. For example, the first power line VDD includes the first sub-wiring 2422 and the second sub-wiring 2424. The first power line VDD is connected to the first voltage terminal; for example, the second sub-wiring 2424 is connected to the second electrode plate CE2 of the storage capacitor through the third via hole VH3; for example, the second sub-wiring 2424 is integral with the second electrode plate CE2 of the storage capacitor, and the second sub-wiring 2422 is connected to the first sub-wiring 2422 through the ninth via hole VH9.

For example, as illustrated in FIG. 4, a second display electrode (for example, the cathode 183) of the light-emitting element 180 is electrically connected to the second power line VSS.

For example, the first power line VDD provides a high-voltage power to the pixel circuit, the second power line VSS is connected to the second voltage terminal, and the second power line VSS provides a low voltage (lower than the high voltage mentioned above) power line to the pixel circuit. In the embodiment illustrated in FIG. 4, the first power line VDD provides a constant first power supply voltage, the first power supply voltage is a positive voltage; the second power line VSS provides a constant second power supply voltage, and the second power supply voltage may be a negative voltage. For example, in some examples, the second power supply voltage is a ground voltage.

It should be noted that, the above reset voltage signal and the above initialization voltage signal may be a same signal.

It should be noted that, the transistors used in the embodiments of the present disclosure may be thin film transistors or field effect transistors or other switching devices with the same characteristics, the thin film transistors may include oxide semiconductor thin film transistors, amorphous silicon thin film transistors, or polysilicon thin film transistors. The source electrode and the drain electrode of the transistor can be symmetrical in structure, thus the source electrode and the drain electrode can be indistinguishable in physical structure, and the source electrode and the drain electrode of all or part of the transistors in the embodiments of the present disclosure can be interchanged as needed.

In some embodiments, as illustrated in FIG. 5A, the pixel circuit includes the above-mentioned thin film transistors T1, T2, T3, T4, T5, T6, and T7; a storage capacitor Cst; and a first gate line GLn, a second gate line GLn−1, a light-emitting control line EM, an initialization line RL, a data line DATA, and a first power line VDD connected to the plurality of thin film transistors T1, T2, T3, T4, T5, T6, and T7.

In the following, the structure of the pixel circuit will be described with reference to FIG. 4 and FIG. 5A to FIG. 5E.

For example, FIG. 5A is a schematic diagram of a layout of a stacked position relationship of the semiconductor layer, the first conductive layer, the second conductive layer, and the third conductive layer of the pixel circuit.

Figure 5B:
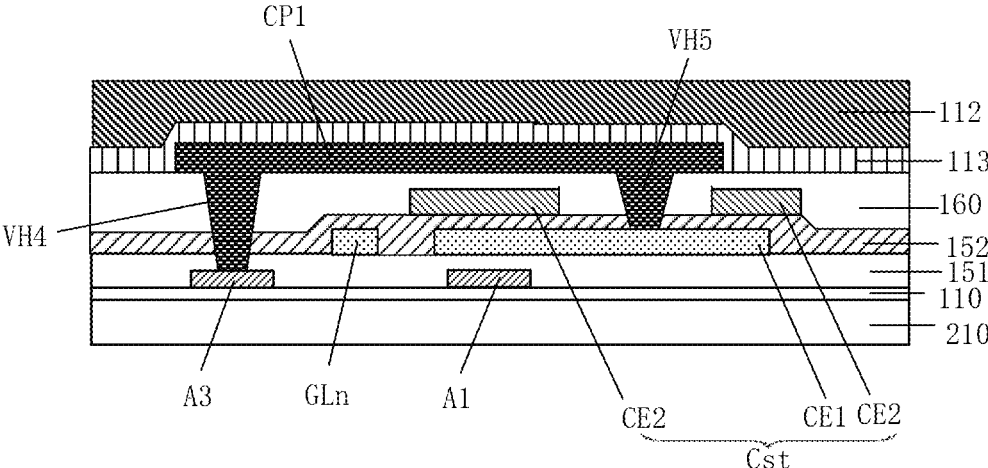
FIG. 5B is a cross-sectional schematic diagram taken along the line A1-B1 in FIG. 5A.
Figure 5C:
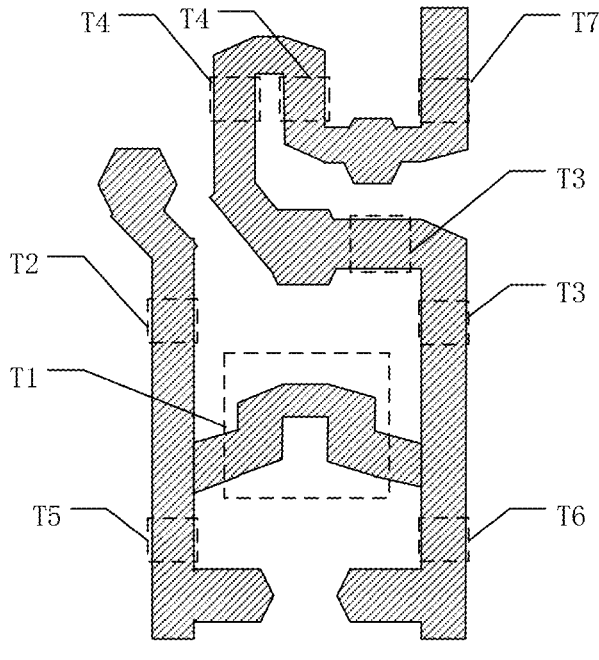
FIGS. 5C to 5F are schematic diagrams of each layer of the pixel circuit of the display substrate provided by at least one embodiment of the present disclosure.

FIG. 5C shows the semiconductor layer of the pixel circuit. For example, the semiconductor layer illustrated in FIG. 5C includes the active layer 120 illustrated in FIG. 3A, and the active layer 120 is, for example, the active layer of the sixth thin film transistor T6. As illustrated in FIG. 5C, the semiconductor layer may be formed by a patterning process by using a semiconductor material layer. The semiconductor layer can be used to manufacture the active layers of the first thin film transistor T1, the second thin film transistor T2, the third thin film transistor T3, the fourth thin film transistor T4, the fifth thin film transistor T5, the sixth thin film transistor T6, and the seventh thin film transistor T7 mentioned above, and each of the active layers may include a source electrode region, a drain electrode region, and a channel area between the source electrode region and the drain electrode region. For example, the semiconductor layer is made of amorphous silicon, polysilicon, or oxide semiconductor materials (for example, indium gallium tin oxide (IGZO)). It should be noted that, the source electrode region and the drain electrode region may be areas doped with n-type impurities or p-type impurities.

For example, the semiconductor layer of the pixel circuit is formed in a same layer as the semiconductor pattern in the first opening peripheral region 203A (in the case that the first opening peripheral region 203A includes the first virtual pixel, the semiconductor pattern is the semiconductor layer of the first virtual pixel, which is described in detail below), that is, the semiconductor layer of the pixel circuit and the semiconductor pattern in the first opening peripheral region 203A may be formed by using a same semiconductor material layer through one same patterning process.

In the display substrate provided by some embodiments of the present disclosure, an insulation layer is formed on the semiconductor layer mentioned above; for clarity, the insulation layer is not illustrated in FIG. 5A and FIG. 5C to FIG. 5F.

Figure 5D:
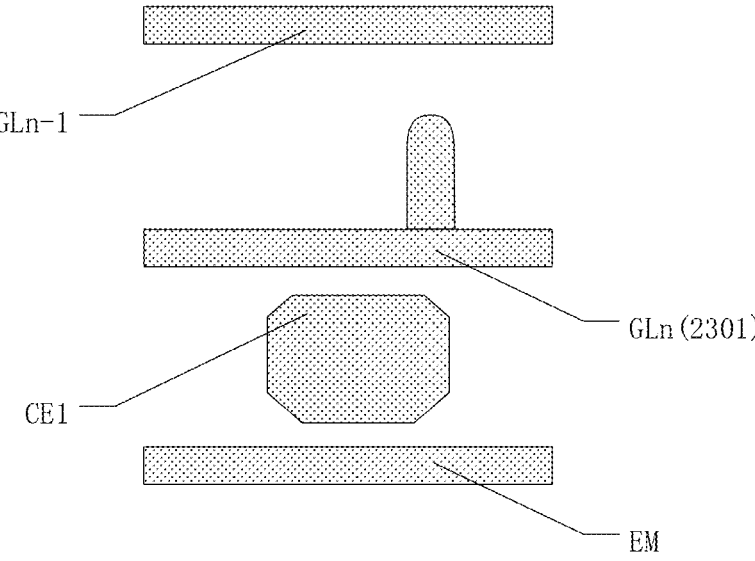

FIG. 5D shows the first conductive layer of the pixel circuit. For example, as illustrated in FIG. 5D, the first conductive layer of the pixel circuit is arranged on the insulation layer mentioned above, so as to be insulated from the semiconductor layer illustrated in FIG. 5D. The first conductive layer may include the first electrode plate CE1 of the storage capacitor Cst, the first gate line GLn, the second gate line GLn−1, the light-emitting control line EM, and the gate electrodes of the first thin film transistor T1, the second thin film transistor T2, the third thin film transistor T3, the fourth thin film transistor T4, the fifth thin film transistor T5, the sixth thin film transistor T6, and the seventh thin film transistor T7. As illustrated in FIG. 5C, the gate electrodes of the second thin film transistor T2, the fourth thin film transistor T4, the fifth thin film transistor T5, the sixth thin film transistor T6, and the seventh thin film transistor T7 are respectively portions of the first gate line GLn and the second gate line GLn−1 that overlap with the semiconductor layer respectively. The third thin film transistor T3 may be a thin film transistor with a double gate structure, and for example, one gate electrode of the third thin film transistor T3 is a portion of the first gate line GLn that overlaps with the semiconductor layer, and the other gate electrode of the third thin film transistor T3 is a protrusion protruding from the first gate line GLn; and the gate electrode of the first thin film transistor T1 may be the first electrode plate CE1. The fourth thin film transistor T4 may be a thin film transistor with a double-gate structure, and the two gate electrodes are respectively overlapping portions of the second gate line GLn−1 and the semiconductor layer.

For example, the gate electrodes of the thin film transistors mentioned above are respectively integral with the corresponding first gate line GLn or the corresponding second gate line GLn−1.

For example, the first signal line 2301/2302/2303/2304 illustrated in FIG. 2B is the first gate line GLn or the second gate line GLn−1, that is, the gate electrodes of each of the thin film transistors, the first signal line, and the first electrode plate CE1 of the storage capacitor Cst are in a same layer, and can be formed simultaneously by a same patterning process.

For example, as illustrated in FIG. 5D, the first signal line 2301 mentioned above is a first gate line GLn; for example, in some embodiments, the first signal line 2301 further include the second gate line GLn−1. In the following, the case that the first signal line 2301 mentioned above serves as the first gate line GLn is taken as an example. For example, in some embodiments, the part of the first signal line 2301 located in the first opening peripheral region 203A illustrated in FIG. 2B and the part of the first signal line 2301 located in the first display region 2011 and the second display region 2012 are in a same layer, that is, the first gate line GLn in FIG. 5D extends from the first display region 2011 into the first opening peripheral region 203A, and then extends from the first opening peripheral region 203A to the second display region 2012, and the part of the first gate line GLn located in the first opening peripheral region 203A and the part of the first gate line GLn located in both the first display region 2011 and the second display region 2012 are arranged in the same layer. Because the gate electrodes and gate lines of the plurality of thin film transistors are arranged in the same layer, for example, are integral, this situation is the situation illustrated in FIG. 3A, the entire first gate line GLn (that is, the first signal line 2301/2302) is in a same layer as the gate electrode 121 and the first electrode plate CE1 of the storage capacitor Cst. For example, the second gate line GLn−1 may be in a same layer as the first gate line GLn.

For example, as illustrated in FIG. 5D, the first electrode plate CE1 of the storage capacitor Cst and the first gate line GLn, that is, the first signal line 2301, are spaced apart from each other, so that the first electrode plate CE1 and the first signal line 2301 are not electrically connected, and no other connection structure is provided between the first electrode plate CE1 and the first signal line 2301 to electrically connect the first electrode plate CE1 with the first signal line 2301. For example, the gate electrode and the first gate line GLn are integral, and the first electrode plate CE1 of the storage capacitor Cst and the gate electrode are also spaced apart from each other, so that the first electrode plate CE1 and the gate electrode are not electrically connected.

Alternatively, the part of the first signal line 2301 located in the first opening peripheral region 203A and the part of the first signal line 2301 located in both the first display region 2011 and the second display region 2012 are respectively arranged in different layers (that is, the part of the first signal line 2301 located in the first opening peripheral region 203A is arranged in a layer different from the gate electrode 121), that is, the first gate line GLn in FIG. 5D extends from the first display region 2011 into the first opening peripheral region 203A, and then extends from the first opening peripheral region 203A to the second display region 2012, and the part of the first gate line GLn located in the first opening peripheral region 203A and the part of the first gate line GLn located in both the first display region 2011 and the second display region 2012 are respectively arranged in different layers. In this case, the part of the first gate line GLn located in the first opening peripheral region 203A is electrically connected to the part of the first gate line GLn located in both the first display region 2011 and the second display region 2012 through the via hole. Because the gate electrodes and the gate lines of the plurality of the thin film transistors are in a same layer, for example, are integral, this case is the case illustrated in FIG. 3B, the part of the first gate line GLn (that is, the first signal line 2301/2302) located in the first opening peripheral region 203A is arranged in the same layer as the gate electrode 121. For example, the part of the first gate line GLn located in the first opening peripheral region 203A is electrically connected to the part of the first gate line GLn located in both the first display region 2011 and the second display region 2012 by a via hole passing through the second gate insulation layer 152 illustrated in FIG. 3B.

In the display substrate provided by some embodiments of the present disclosure, another insulation layer is provided on the first conductive layer mentioned above, the insulation layer includes the second gate insulation layer 152 illustrated in FIG. 5B, which is not illustrated in FIG. 5A and FIG. 5C to FIG. 5F.

Figure 5E:
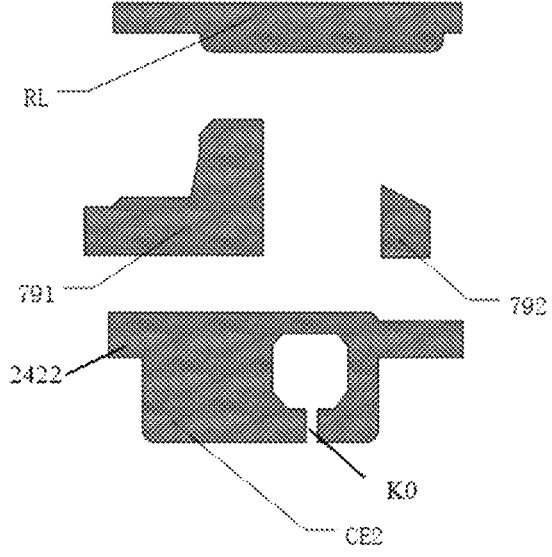

FIG. 5E shows the second conductive layer of the pixel circuit. For example, combining FIG. 5B with FIG. 5E, the second conductive layer of the pixel circuit includes the second electrode plate CE2 of the storage capacitor Cst, the initialization line RL and the second sub-wiring 2422, that is, the second sub-wiring 2422 is in a same layer as the second electrode plate CE2 of the storage capacitor Cst. The second electrode plate CE2 at least partially overlaps with the first electrode plate CE1 to form the storage capacitor Cst.

For example, the second electrode plate CE2 illustrated in FIG. 5E is provided with a gap K0, in some embodiments, the second electrode plate CE2 may not be provided with the gap K0. The embodiment of the present disclosure does not limit the specific structure of the second electrode plate CE2.

For example, the first signal line 2301 in the first opening peripheral region 203A is formed in a same layer as the second conductive layer of the pixel circuit, that is, the first signal line 2301 in the first opening peripheral region 203A and the second conductive layer of the pixel circuit are formed by a same conductive material layer and are formed by a same patterning process, that is, the first signal line 2301, the second electrode plate CE2 and the initialization line RL are formed by a same conductive material layer and a same patterning process.

For example, in some embodiments, the second conductive layer further includes a first light shielding component 791 and a second light shielding component 792. An orthographic projection of the first light shielding component 791 on the base substrate 210 covers an orthographic projection of an active layer of the second thin film transistor T2 on the base substrate, and an orthographic projection of an active layer between the drain electrode of the third thin film transistor T3 and the drain electrode of the fourth thin film transistor T4 on the base substrate, to prevent external light from affecting the active layers of all of the second thin film transistor T2, the third thin film transistor T3, and the fourth thin film transistor T4. An orthographic projection of the second light shielding component 792 on the base substrate 210 covers an orthographic projection of an active layer between two gate electrodes of the third thin film transistor T3 on the base substrate, to prevent external light from affecting the active layer of the third thin film transistor T3. The first light shielding component 791 can be an integral structure with the second light shielding component 792 of the adjacent pixel circuit, and the first light shielding component 791 is electrically connected to the first power line VDD by a tenth via hole VH9' passing through the insulation layer, as illustrated in FIG. 5A.

In the display substrate provided by some embodiments of the present disclosure, another insulation layer is provided on the second conductive layer mentioned above, the insulation layer includes the interlayer insulation layer 160 illustrated in FIG. 3A, which is not illustrated in FIG. 5A and FIG. 5C to FIG. 5F.

Figure 5F:
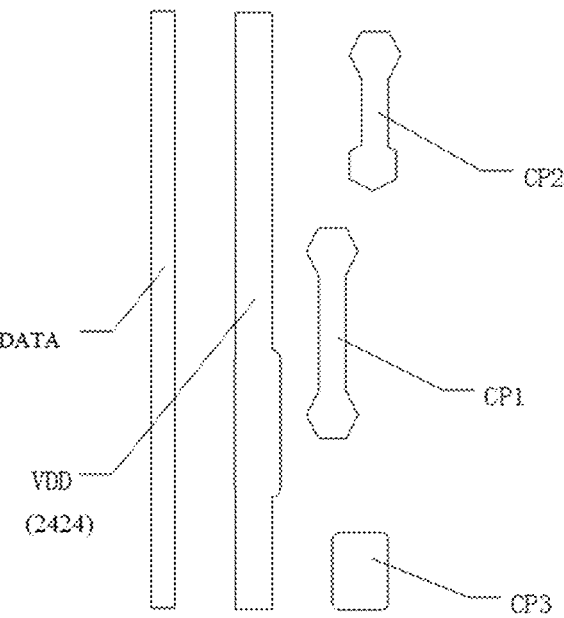

FIG. 5F shows the third conductive layer of the pixel circuit. For example, as illustrated in FIG. 5F, the third conductive layer of the pixel circuit includes a data line DATA (for example, the data line DATA is the second signal line 241/242 in FIG. 2A) and a second sub-wiring 2424 of the first power line VDD, that is, the second sub-wiring 2424 is arranged on a same layer as the data line DATA. Combing FIG. 5A to FIG. 5B and FIG. 5F, the data line DATA is connected to a source electrode region of the second thin film transistor T2 in the semiconductor layer through at least one via hole (for example, a via hole VH1) in all of the first gate insulation layer, the second gate insulation layer, and the interlayer insulation layer. The first power line VDD is connected to a source electrode region of the semiconductor layer corresponding to the fifth thin film transistor T5 through at least one via hole (for example, a via hole VH2) in all of the first gate insulation layer, the second gate insulation layer and the interlayer insulation layer. The first power line VDD is connected to the second electrode plate CE2 in the second conductive layer through at least one via hole (for example, a via hole VH3) in the interlayer insulation layer.

For example, combining FIG. 5A and FIG. 5F, the third conductive layer further includes a first connection component CP1, a second connection component CP2, and a third connection component CP3. One end of the first connection component CP1 is connected to a drain electrode region of the semiconductor layer corresponding to the third thin film transistor T3 by at least one via hole (for example, a via hole VH4) passing through all of the first gate insulation layer, the second gate insulation layer, and the interlayer insulation layer, the other end of the first connection component CP1 is connected to the gate electrode of the first thin film transistor T1 in the first conductive layer by at least one via hole (for example, a via hole VH5) passing through both the second gate insulation layer and the interlayer insulation layer. One end of the second connection component CP2 is connected to the initialization line RL through a via hole (for example, a via hole VH6) in the interlayer insulation layer, the other end of the second connection component CP2 is connected to both the source electrode region of the seventh thin film transistor T7 and the source electrode region of the fourth thin film transistor T4 in the semiconductor layer by at least one via hole (for example, a via hole VH7) passing through all of the first gate insulation layer, the second gate insulation layer, and the interlayer insulation layer. The third connection component CP3 is connected to the drain electrode region of the sixth thin film transistor T6 in the semiconductor layer by at least one via hole (for example, a via hole VH8) passing through all of the first gate insulation layer, the second gate insulation layer, and the interlayer insulation layer.

In the display substrate provided by some embodiments of the present disclosure, a protective layer is formed on the third conductive layer mentioned above, and the protective layer includes the first planarization layer 112 illustrated in FIG. 5B, which is not illustrated in FIG. 5A and FIG. 5C to FIG. 5F. For example, a sub-layer of the barrier wall 28 in the first opening peripheral region 203A is formed in a same layer as the protective layer, that is, a sub-layer of the barrier wall 28 in the first opening peripheral region 203A and the protective layer are formed by a same insulation material layer and are formed by a same patterning process.

Figure 6:
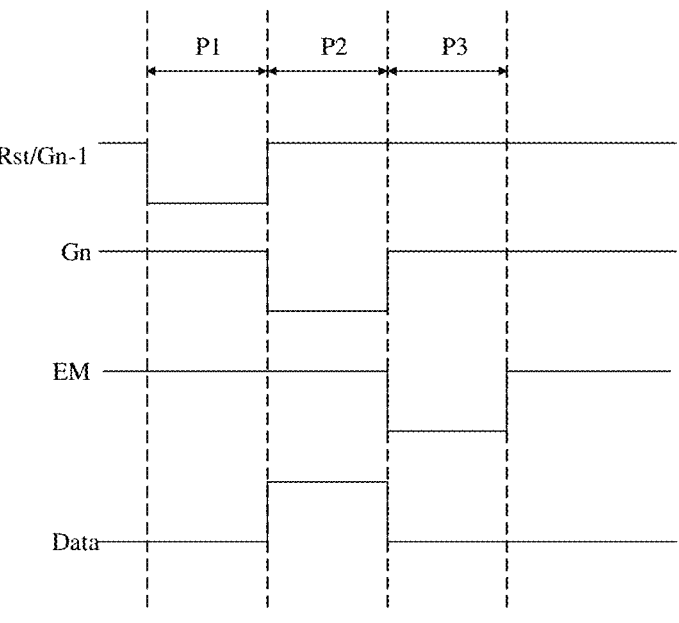
FIG. 6 is a signal timing diagram in a working process of the pixel circuit illustrated in FIG. 4.

FIG. 6 is a signal timing diagram of the pixel circuit illustrated in FIG. 4. The working principle of the pixel circuit illustrated in FIG. 4 will be described below in combination with the signal timing diagram illustrated in FIG. 6. For example, herein, the first light-emitting control line EM1 and the second light-emitting control line EM2 in FIG. 4 as a same common light-emitting control line is taken as an example. In some other embodiments, the first light-emitting control line EM1 and the second light-emitting control line EM2 may also be different signal lines, which respectively provide a first light-emitting control signal and a second light-emitting control signal which are different from each other.

In addition, herein, the case that all the transistors illustrated in FIG. 6 are P-type transistors is taken as an example. The gate electrode of each of the P-type transistors is turned on in the case that a low level is connected, and is turned off in the case that a high level is connected. The following embodiments are the same as this, which will not be repeated herein.

As illustrated in FIG. 6, the working process of the pixel circuit includes three stages, and the three stages are a initialization stage P1, a data writing and compensation stage P2, and a light-emitting stage P3 respectively, the figure shows timing waveforms of each signals in each of the stages.

In the initialization stage P1, the second gate line Gn−1 provides a reset signal Rst, the fourth transistor T4 and the seventh transistor T7 are turned on by a low level of the reset signal, and an initialization signal (a low-level signal, for example, can be grounded or other low-level signals) is applied to the first gate electrode of the first transistor T1, and the initialization signal is applied to an Node N4, that is, the light-emitting element 180 is reset, so that the light-emitting element 180 can be displayed in a black state without emitting light before the light-emitting stage P3, a display effect such as a contrast of the display apparatus using the pixel circuit is improved. At the same time, the second transistor T2, the third transistor T3, the fifth transistor T5, and the sixth transistor T6 are turned off by the high-level signals connected to them respectively.

In the data writing and compensation stage P2, the first gate line GLn provides a scanning signal Gn−1, the data line DATA provides a data signal Data, and the second transistor T2 and the third transistor T3 are turned on. At the same time, the fourth transistor T4, the fifth transistor T5, the sixth transistor T6, and the seventh transistor T7 are turned off by the high-level signals connected to them respectively. After the data signal Data passes through the second transistor T2, the first transistor T1, and the third transistor T3, the first node N1 is charged (that is, the storage capacitor Cst is charged), that is, an electric potential of the first node N1 gradually increases. It is easy to understand that since the second transistor T2 is turned on, the electric potential of the second node N2 remains at Vdata, at the same time, according to the characteristics of the first transistor T1, in the case that the electric potential of the first node N1 increases to Vdata+Vth, the first transistor T1 is turned off, and the charging process ends. It should be noted that, Vdata represents a voltage value of the data signal Data, Vth represents a threshold voltage of the first transistor T1, since in the embodiment, the first transistor T1 is described as a P-type transistor, the threshold voltage Vth here can be a negative value.

After the data writing and compensation stage P2, the electric potentials of the first node N1 and the third node N3 are both Vdata+Vth, that is, the voltage information with the data signal Data and the threshold voltage Vth is stored in the storage capacitor Cst, and is used providing a gray scale display data and compensating the threshold voltage of the first transistor T1 during the subsequent light-emitting stage.

In the light-emitting stage P3, the light-emitting control line provides a light-emitting control signal EM, and the fifth transistor T5 and the sixth transistor T6 are turned on by the low level of the light-emitting control signal EM. The second transistor T2, the third transistor T3, the fourth transistor T4, and the seventh transistor T7 are turned off in the case that the high level is connected to them respectively. At the same time, the electric potential of the first node N1 is Vdata+Vth, and the electric potential of the second node N2 is VDD, thus the first transistor T1 is also turned on at this stage. The anode and cathode of the light-emitting element 180 are respectively connected to the first power supply voltage (high voltage) and the second voltage voltage VSS (low voltage) provided by the first power line VDD, so that the light-emitting element 180 emits light under the action of the driving current flowing through the first transistor T1.

Figure 7A:
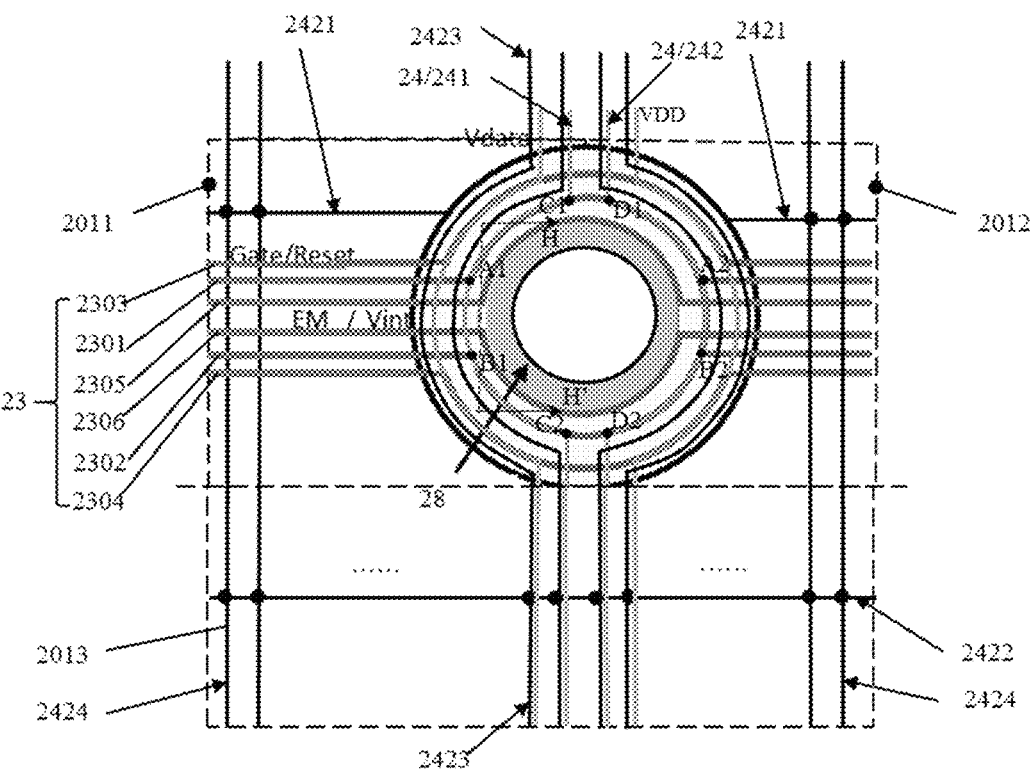
FIG. 7A is a partial enlarged schematic diagram of the first opening region in FIG. 2A.
Figure 7B:
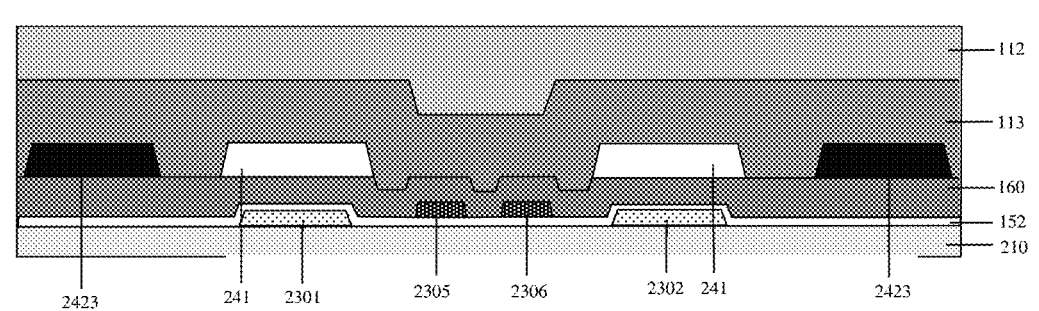
FIG. 7B is a cross-sectional schematic diagram taken along the line H-H' in FIG. 7A.

FIG. 7A is a partial enlarged schematic diagram of the first opening region in FIG. 2A, and FIG. 7B is a cross-sectional schematic diagram taken along a line H-H' in FIG. 7A.

The embodiment illustrated in FIGS. 7A and 7B has the following differences from the embodiment illustrated in FIGS. 2B and 2C. As illustrated in FIG. 7A and FIG. 7B, the second signal line 241/242 is the second sub-wiring of the first power line VDD, and the second sub-wiring 241/242 sequentially passes through the first opening peripheral region 203A and the third display region 2013, for example, in the embodiment, the second sub-wiring 241/242 sequentially passes through the second part 2013D of the third display region 2013, the first opening peripheral region 203A, and the first part 2013C of the third display region 2013 along the second direction R2. For example, as illustrated in FIG. 7B, the second sub-wiring 241/242 is located on a side of both the first signal line 2301/2302 and the light-emitting control line 2305/2306 away from the base substrate 210.

The display substrate provided in the embodiment can achieve same or similar technical effects as the above-mentioned embodiment, which will not be repeated herein. Other features and corresponding technical effects of the display substrate provided in this embodiment are the same as those in the previous embodiments, please refer to the previous descriptions.

Figure 8A:
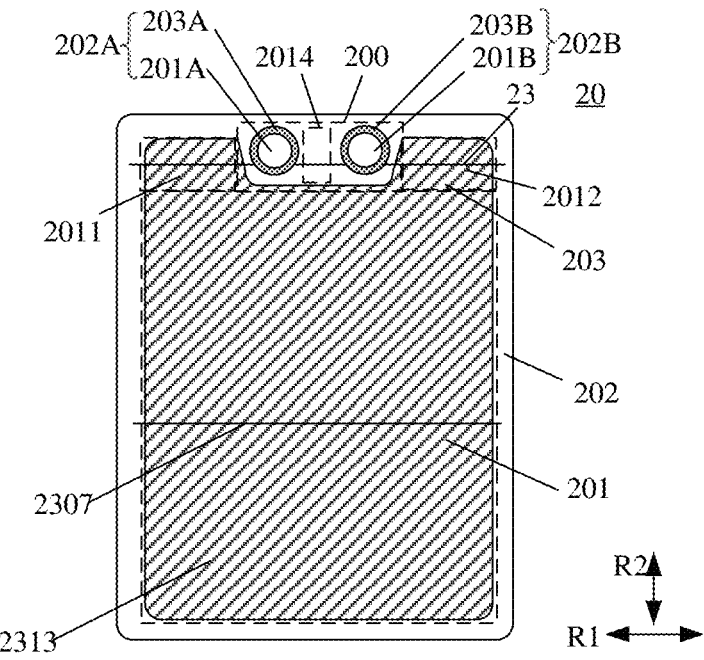
FIG. 8A is a planar schematic diagram of still another display substrate provided by at least one embodiment of the present disclosure.
Figure 8B:
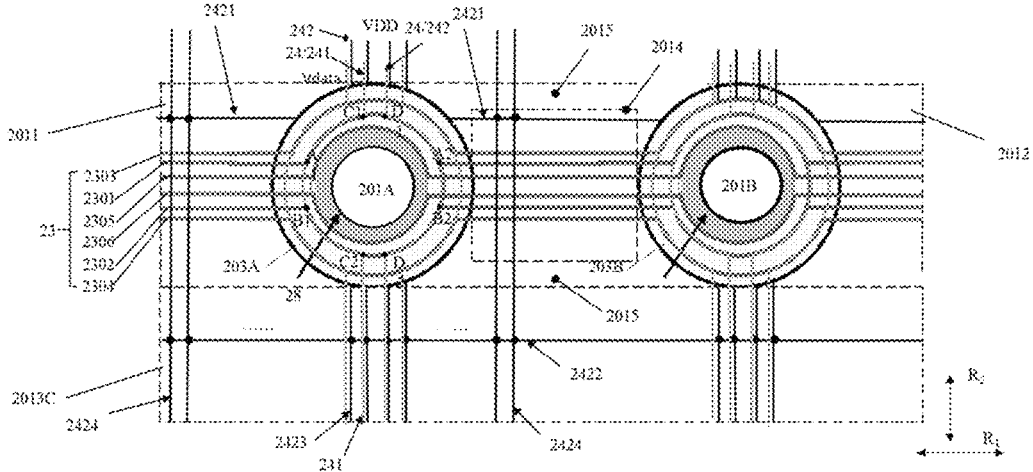
FIG. 8B is a partial enlarged schematic diagram of a first opening region and a second opening region in FIG. 8A.

Illustratively, FIG. 8A is a planar schematic diagram of still another display substrate provided by at least one embodiment of the present disclosure, and FIG. 8B is a partial enlarged schematic diagram of the first opening region and the second opening region in FIG. 8A.

The embodiment illustrated in FIG. 8A and FIG. 8B has the following differences from the embodiment illustrated in FIG. 2A. In FIG. 8A and FIG. 8B, the display substrate 20 includes an opening region 200, the opening region 200 includes a first opening region 202A, a second opening region 202B adjacent to the first opening region 202A, and an inter-opening region 2014. The first opening region 202A includes a first opening 201A and a first opening peripheral region 203A surrounding the first opening 201A; and the second opening region 202B includes a second opening 201B and a second opening peripheral region 203B surrounding the second opening 201B. The inter-opening region 2014 is located between the first opening region 202A and the second opening region 202B.

For example, in the embodiment illustrated in FIG. 8A and FIG. 8B, the second opening region 202B and the first opening region 202A are arranged along the first direction R1, in this way, the inter-opening region 2014 is located between the first opening region 202A and the second opening region 202B in the first direction R1. The first display region 2011 is located on a side of the first opening region 202A away from the inter-opening region 2014, and the second display region 2012 is located on a side of the second opening region 202B away from the inter-opening region 2014. In this case, the first display region 2011 is located on the first side of the first opening region 202A, and the second display region 2012 is located on the second side of the second opening region 201B. That is, the first display region, the first opening region, the inter-opening region, the second opening region, and the second display region are sequentially arranged along the first direction. For the first opening region 202A and the second opening region 201B, respectively, it is still satisfied that the first display region 2011 is located on the first side of the first opening region 202A, the second display region 2012 is located on the second side of the first opening region 202A, and the first side and the second side are opposite to each other in the first direction R1. The first signal line 23 sequentially passes through the first display region 2011, the first opening peripheral region 203A, the inter-opening region 2014, the second opening peripheral region 203B, and the second display region 2012 along the first direction R1. The arrangement of the first signal line 23 and the second signal line 24 in the second opening region 202B is the same as that in the first opening region 202A in the above-mentioned embodiment, and related technical features can be referred to the previous descriptions, which is not repeated herein.

Figure 8C:
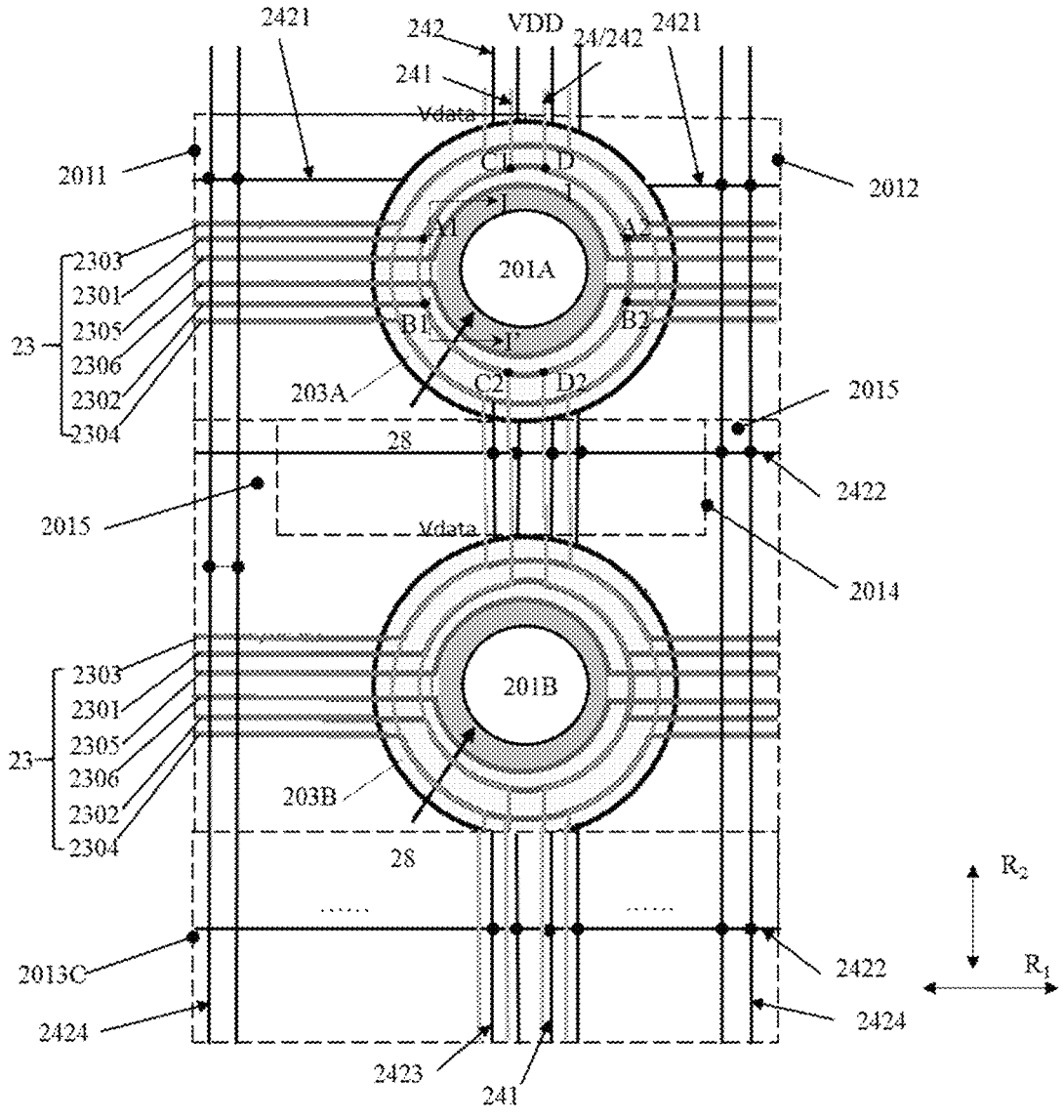
FIG. 8C is a partially enlarged schematic diagram of a first opening region and a second opening region of another display substrate provided by at least one embodiment of the present disclosure.

For example, in the embodiment illustrated in FIG. 8C, the second opening region 202B and the first opening region 202A are arranged along the second direction R2, thus the inter-opening region 2014 is located between the first opening region 202A and the second opening region 202B in the second direction R2. The second signal line 24 sequentially passes through the first opening peripheral region 203A, the inter-opening region 2014, the second opening peripheral region 203B and the third display region 2013 along the second direction R2. The other features illustrated in FIG. 8C except for an arrangement direction of the second opening region 202B and the first opening region 202A are the same as those in FIG. 8B, which will be not repeated herein. In this case, for the first opening region 202A, the second winding line portion C1C2 extends around the first opening 201A from the third side of the first opening 201A to the fourth side of the first opening 201A, and a third side of the first opening 201A and a fourth side of the first opening 201A are opposite to each other in the second direction R2; for the second opening region 202B, the second winding line portion C1C2 located in the second opening peripheral region 203B of the second opening region 202B extends around the second opening 201B from the third side of the second opening 201B to the fourth side of the second opening 201B, and the third side of the second opening 201B and the fourth side of the second opening 201B are opposite to each other in the second direction R2.

For example, for the display substrate illustrated in FIG. 8B and FIG. 8C, at least one selected from a group consisting of the inter-opening region 2014, the first opening peripheral region 203A, and the second opening peripheral region 203B includes one or more first virtual sub-pixels, although the first virtual sub-pixel is provided with at least a portion of the pixel circuit structure or a substantially complete pixel circuit structure, but the first virtual sub-pixel does not emit light during operation, so that the first virtual sub-pixel does not participate in the display operation. For example, the first virtual sub-pixel includes a first virtual pixel circuit, and the first virtual pixel circuit includes a first compensation capacitor, providing load compensation for the signal line.

Figure 9:
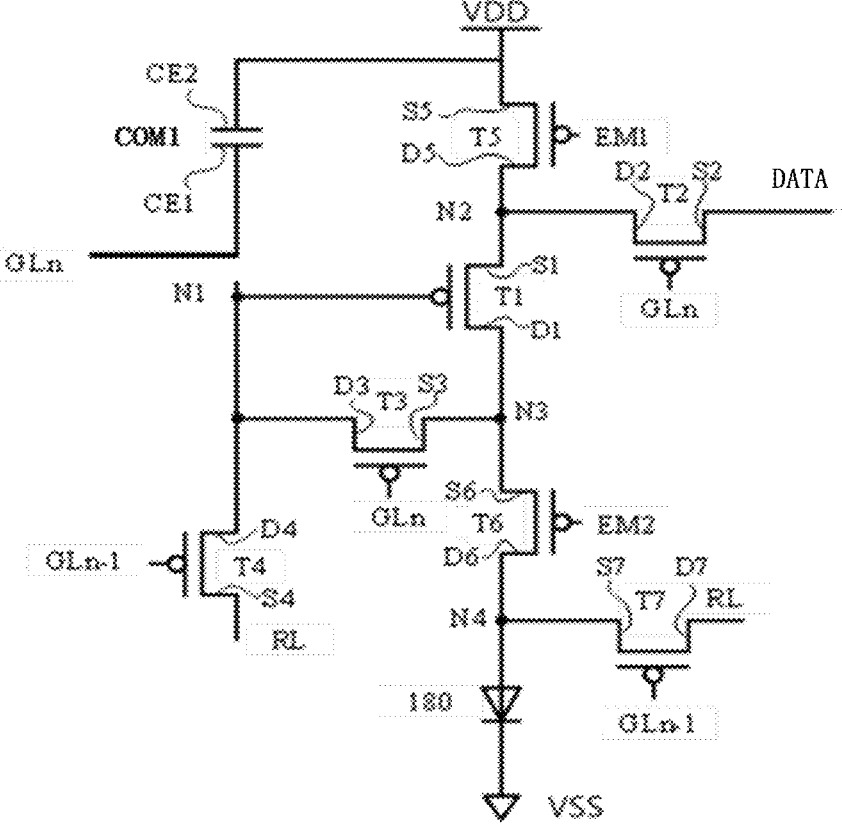
FIG. 9 is an equivalent circuit diagram of the first virtual pixel circuit in the display substrate provided by at least one embodiment of the present disclosure.
Figure 10A:
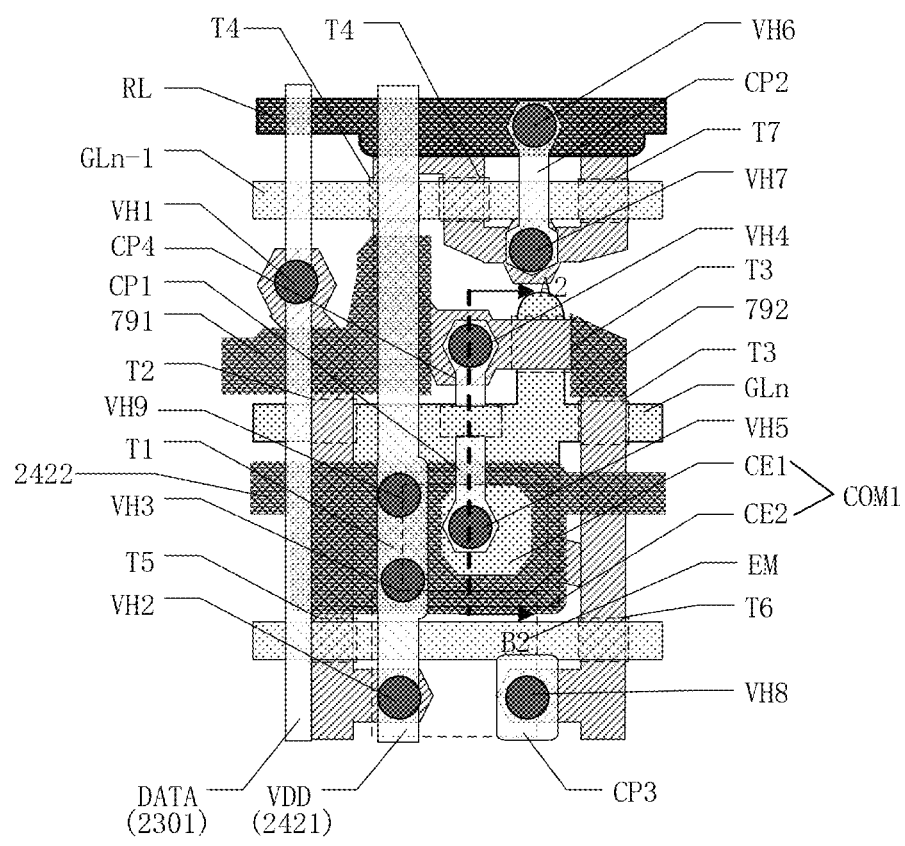
FIG. 10A is a schematic diagram of a planar layout of the first virtual pixel circuit in the display substrate provided by at least one embodiment of the present disclosure.
Figure 10B:
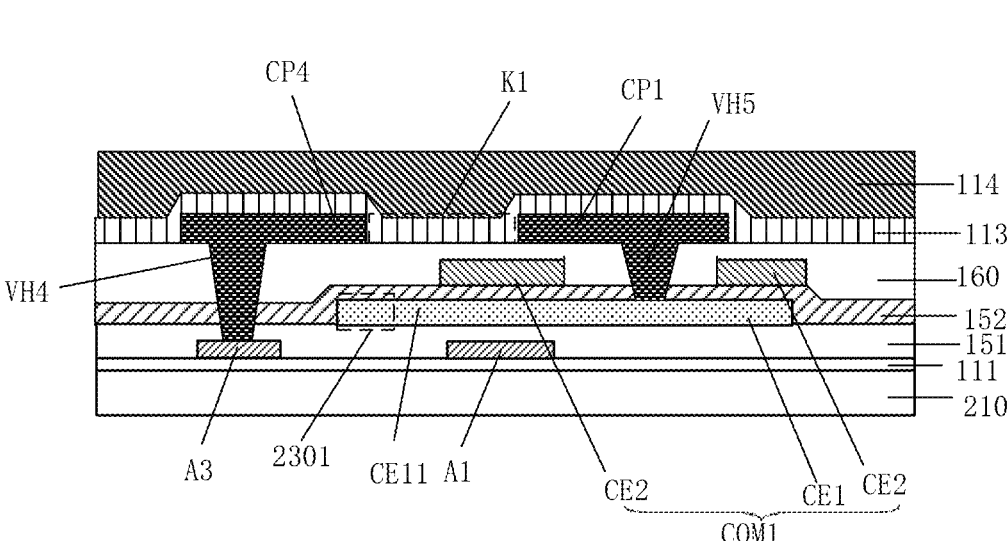
FIG. 10B is a cross-sectional schematic diagram taken along the line A2-B2 in FIG. 10A.

FIG. 9 is an equivalent circuit diagram of the first virtual pixel circuit in a display substrate provided by at least one embodiment of the present disclosure; FIG. 10A is a schematic diagram of a planar layout of the first virtual pixel circuit in the display substrate according to at least one embodiment of the present disclosure; FIG. 10B is a cross-sectional schematic diagram taken along a line A2-B2 in FIG. 10A; and FIG. 10C to FIG. 10F are schematic diagrams of each layer of a first virtual pixel circuit of a display substrate provided by at least one embodiment of the present disclosure. As described above, the pixel circuit structure of the first virtual sub-pixel is at least partially or substantially the same as the pixel circuit of the sub-pixel in the display region, so that the pixel circuit structure of the first virtual sub-pixel can be understood in combination with the schematic diagrams illustrated in FIG. 4 and FIG. 5A to FIG. 5F.

As illustrated in FIG. 4 and FIG. 9, the difference between the pixel circuit of the first virtual sub-pixel and the pixel circuit of the sub-pixel of the display region includes a different connection mode of the storage capacitor. In the pixel circuit illustrated in FIG. 4, the storage capacitor includes a first electrode plate CE1 and a second electrode plate CE2, the second electrode plate CE2 is electrically connected to the first power line VDD, and the first electrode plate CE1 is electrically connected to the first gate electrode of the first thin film transistor T1 and the third drain electrode D3 of the third thin film transistor T3. In the pixel circuit illustrated in FIG. 9, the storage capacitor is converted into a compensation capacitor, and is provided with a changed connection relationship, one of the electrode plates is connected to the gate line GLn, and is disconnected from the third drain electrode D3 of the third thin film transistor T3.

As illustrated in FIG. 10A and FIG. 10B, the first compensation capacitor COM1 includes a first electrode plate CE1 and a second electrode plate CE2. As illustrated in FIG. 10B, the first electrode plate CE1 of the first compensation capacitor COM1 is arranged in a same layer as the first signal line 2301 and is electrically connected to the first signal line 2301, for example, the first electrode plate CE1 of a compensation capacitor COM1 and the first signal line 2301 are integral. The second electrode plate CE2 of the first compensation capacitor COM1 and the first electrode plate COM1 of the first compensation capacitor COM1 are respectively arranged in different layers and are insulated from each other; for example, an orthographic projection of the first electrode plate CE1 of the first compensation capacitor COM1 on the base substrate 210 at least partially overlaps with an orthographic projection of the second electrode plate CE2 of the first compensation capacitor COM1 on the base substrate 210. The first compensation capacitor COM1 provides load compensation to the first signal line 2301 connected to the first compensation capacitor COM1.

Figure 10C:
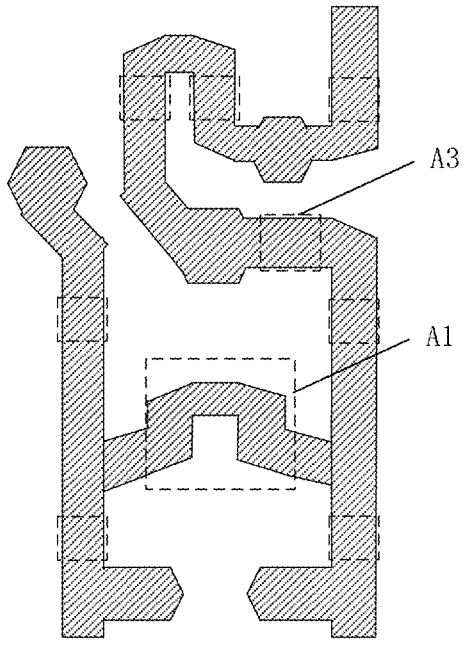
FIGS. 10C to 10G are schematic diagrams of each layer of the first virtual pixel circuit of a display substrate provided by at least one embodiment of the present disclosure.

For example, the first virtual pixel circuit includes a first virtual semiconductor layer, and the first virtual semiconductor layer is located on a side of the first signal line close to the base substrate. FIG. 10C shows a pattern of the first virtual semiconductor layer of the first virtual pixel circuit, for example, a pattern of the first virtual semiconductor layer is the same as a pattern of the semiconductor layer of the pixel circuit of the sub-pixel in the display region, to maintain the etching uniformity of the display substrate, the manufacturing process of the first virtual pixel circuit is simplified, and the manufacturing cost is reduced.

Figure 10D:
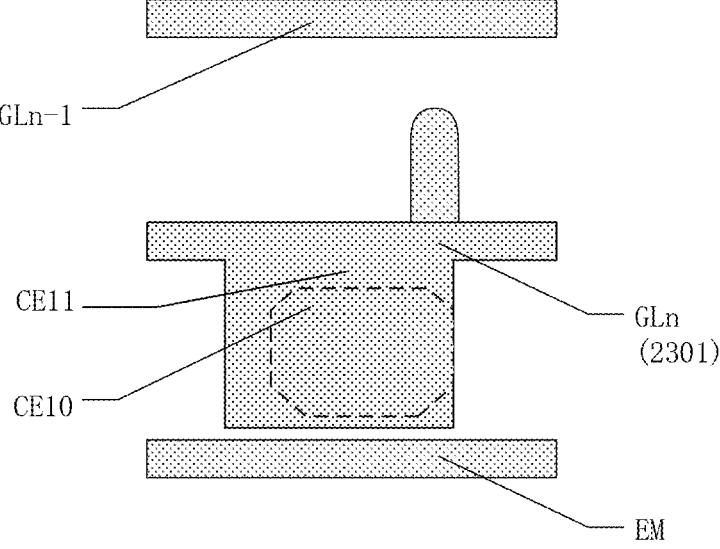
Figure 10E:
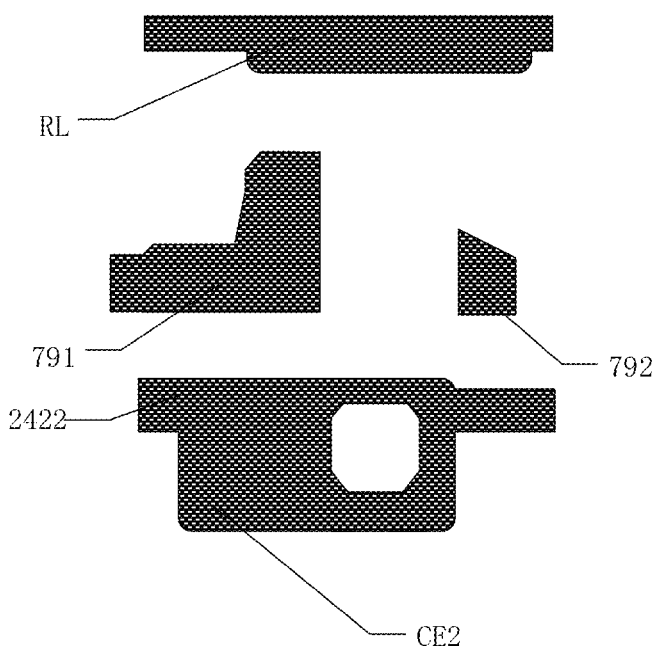

FIG. 10D shows a structure of the first virtual pixel circuit located on the first conductive layer, and FIG. 10E shows a structure of the first virtual pixel circuit in the second conductive layer.

Combining FIG. 10A to FIG. 10B and FIG. 10D to FIG. 10E, the first electrode plate CE1 of the first compensation capacitor COM1 includes a first body portion CE10 and a first extension portion CE11.

The first electrode plate CE1 of the first compensation capacitor COM1 is located on the first conductive layer, that is, the gate electrodes of each of the thin film transistors of the pixel circuit are arranged in a same layer as the first electrode plate of the storage capacitor CST and the first electrode plate of the first compensation capacitor COM1. In addition, the first electrode plate CE1 of the first compensation capacitor COM1 is located on the first side of the first signal line 2301 (for example, the first signal line 2301 is the first gate line GLn) in the second direction R2; the first extension portion CE11 extends from the first body portion toward the first signal line, the first extension portion CE11 is located on the first side of the first signal line 2301 in the second direction, and is located between the first body portion CE10 and the first signal line 2301. The first body portion CE10 is electrically connected to the first signal line 2301 through the first extension portion CE11. For example, the first body portion CE10 has substantially a same width in the first direction as the first extension portion CE11; for another example, in the first direction, the width of the first body portion CE10 is greater than the width of the first extension portion CE11, that is, the first body portion CE10 and the first signal line 2301 are electrically connected through a narrowed first extension portion CE11 between them; for another example, in the first direction, the width of the first body portion CE10 is smaller than the width of the first extension portion CE11, that is, the first body portion CE10 and the first signal line 2301 are electrically connected through an enlarged first extension portion CE11 between them.

The second electrode plate CE2 of the first compensation capacitor COM1 is in the second conductive layer, that is, the second electrode plate of the first compensation capacitor COM1 and the second electrode plate of the storage capacitor CST are in a same layer. In addition, the second electrode plate CE2 of the first compensation capacitor COM1 at least partially overlaps with the first electrode plate CE1 of the first compensation capacitor COM1 in a direction perpendicular to the base substrate 210, as illustrated in FIG. 10B, to form a first compensation capacitor COM1. For example, the pattern of the first body portion CE10 is the same as the pattern of the first electrode plate of the storage capacitor of the pixel circuit in the sub-pixel of the display region.

Compared with the first electrode plate CE1 of the storage capacitor CST in the pixel circuit of the display region illustrated in FIG. 5B, in the first virtual sub-pixel, because of the existence of the first extension portion CE11, the area of the first electrode plate CE1 of the first compensation capacitor COM1 is increased, so that an overlapping region of the first electrode plate CE1 of the first compensation capacitor COM1 and the second electrode plate CE2 of the first compensation capacitor COM1 is increased, to increase the capacitance of the first compensation capacitor COM1, thus the load of the first signal line 2301 is further increased.

For example, as illustrated in FIG. 10D, the first body portion CE10, the first extension portion CE11, and the first signal line 2301 are integral.

Figure 10F:
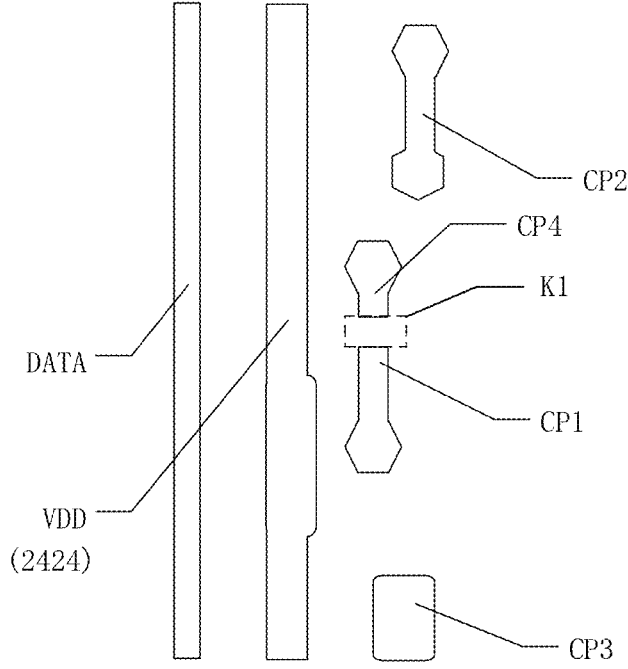
Figure 10G:
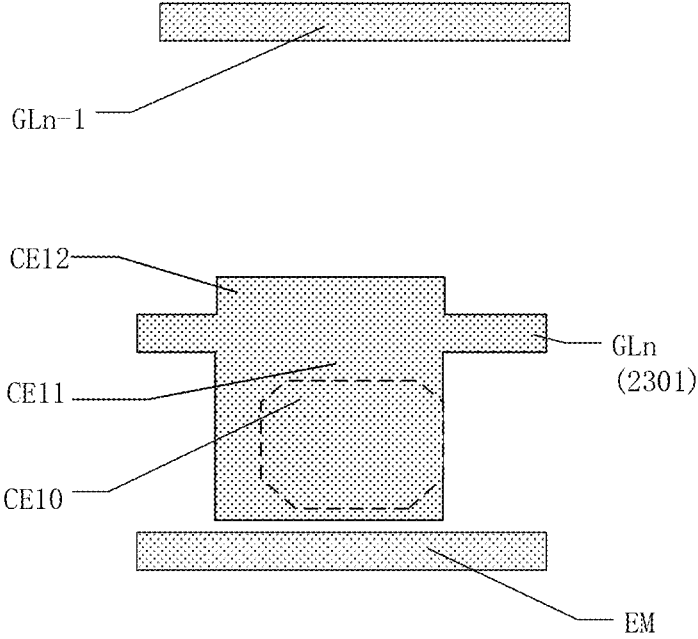

FIG. 10G shows another structure of the first virtual pixel circuit located on the first conductive layer. For example, as illustrated in FIG. 10G, the first electrode plate CE1 of the first compensation capacitor COM1 further includes a second extension portion CE12. The second extension portion CE12 extends from the first signal line 2301 in a direction away from the first body portion 2301, and is located on the second side of the first signal line 2301 in the second direction R2 and is electrically connected to the first signal line 2301, and the second side of the first signal line 2301 is opposite to the first side of the first signal line 2301, so that the area of the first electrode plate CE1 of the first compensation capacitor COM1 is further increased. In this way, if the area of the second electrode plate of the first compensation capacitor COM1 is increased at the same time, the first compensation capacitor COM1 can be further increased, to meet the requirements for a greater degree of compensation for the first signal line.

For example, as illustrated in FIG. 10G, the first body portion CE10, the first extension portion CE11, the first signal line 2301, and the second extension portion CE12 are integral.

In at least one embodiment, for example, the width in the first direction R1 of the first extension portion CE11, the width of the second extension portion CE12 in the first direction R1, and the width of the first body portion CE10 in the first direction R1 are basically the same, to make full use of a limited space to achieve a wider range of compensation requirements.

The first pixel row and the second pixel row of the first pixel array in both the first display region 2011 and the second display region 2012 are all interrupted by a whole structure constituted of the first opening region 202A, the inter-opening region 2014, and the second opening region 202B.

The inter-opening region 2014 includes a first virtual sub-pixel row corresponding to the first pixel row and a second virtual sub-pixel row corresponding to the second pixel row. The first signal line configured to provide a first display signal to the first pixel row passes through the first pixel row and the first virtual pixel row, and the first signal line configured to provide the first display signal to the second pixel row passes through the second pixel row and the second virtual pixel row. A total number of the pixels in the first pixel row is different from a total number of the pixels in the second pixel row. Therefore, the load of the first signal line configured to provide the first display signal to the first pixel row is different from the load of the first signal line configured to provide the first display signal to the second pixel row, in this regard, for example, a total number of first compensation capacitors COM1 in the first virtual pixel row is different from a total number of first compensation capacitors COM1 in the second virtual pixel row, to perform load compensation on these first signal lines with different loads, so that the loads of these first signal lines are basically the same, thus the adverse effect on the display quality due to the arrangement of the first opening region is reduced.

Figure 11:
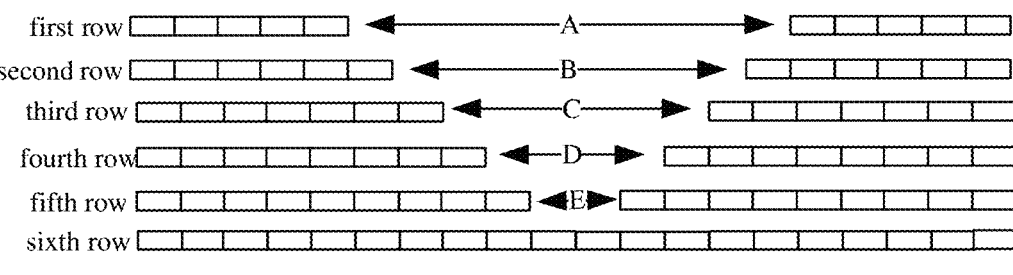
FIG. 11 is a planar schematic diagram of an arrangement of pixels near the first opening region or the second opening region of the display substrate provided by at least one embodiment of the present disclosure.

For example, FIG. 11 shows six rows of the pixels near the first opening region or the second opening region. For example, in some examples, as illustrated in FIG. 11, assuming that the sixth row of sub-pixels is a row of full pixels, the total load of the first signal line passing through the row of full pixels is M. For example, the pixels in the first row to the fifth row are the pixels on both sides of the first opening region, which are non-full pixel rows, and the number of the pixels gradually increases from the first row to the fifth row. In this case, by providing the first compensation capacitor COM1 for the sub-pixels of the pixels from the first row to the fifth row, the load of the first signal line of each row of the pixels approaches or is substantially equal to M. For example, a total number of the first compensation capacitor COM1 provided for the sub-pixels of the pixels from the first row to the fifth row is gradually reduced. Similarly, the number of second compensation capacitors described below can also be similarly designed according to requirements.

FIG. 10F shows a structure of the first virtual pixel circuit in the third conductive layer. Combining FIG. 10A to FIG. 10B and FIG. 10F, the first virtual pixel circuit further includes a first transfer electrode CP1, and the first transfer electrode CP1 is electrically connected to the first electrode plate CE1 of the first compensation capacitor COM1, and is disconnected from other part of the first virtual pixel circuit except the first signal line 2301 by a gap K1. The display substrate further includes a disconnection electrode CP4, and the disconnection electrode CP4 is electrically connected to the first virtual semiconductor through the via hole VH4.

As illustrated in FIG. 10B, the first virtual semiconductor includes a part A1 and a part A3, the disconnection electrode CP4 is electrically connected to the part A1 through the via hole VH4. The disconnection electrode CP4 and the first transfer electrode CP1 are arranged in a same layer, for example, are all located in the third conductive layer illustrated in FIG. 10F, and the disconnection electrode CP4 and the first transfer electrode CP1 are spaced apart so as not to be connected to each other, so that the first electrode plate CE1 of the first compensation capacitor COM1 is disconnected from the other part of the first virtual pixel circuit except for the first signal line 2301, thus the first virtual pixel circuit is disconnected, the first virtual sub-pixel does not perform a display function, and does not affect two substrates of the first compensation capacitor COM1. For example, the gap K1 is provided between the disconnection electrode CP4 and the first transfer electrode CP1, and the disconnection electrode CP4 and the first transfer electrode CP1 are disconnected (broken) by the gap K1.

Comparing FIG. 10F with FIG. 5F, the patterns of the data line DATA, the first power line VDD, the second connection component CP2 and the third connection component CP3 in the two figures are all the same, by disconnecting CP1 in FIG. 5F, the first transfer electrode CP1 and the disconnection electrode CP4 illustrated in FIG. 10F are obtained. The first virtual pixel circuit and the pixel circuit in the display region are provided with a same circuit design, except for the shape of the first electrode plate CE1 of the first compensation capacitor COM1, and the disconnection of the first plate CE1 of the first compensation capacitor COM1 from other parts of the first virtual pixel circuit.

As described above, although in the above embodiments, comparing the pixel circuit illustrated in FIG. 9 with the pixel circuit illustrated in FIG. 4, a difference includes the shape of the first electrode plate CE1 of the first compensation capacitor COM1 and the connection relationship between the first electrode plate CE1 of the first compensation capacitor COM1 and the first signal line, however, in other examples of the embodiment, the pixel circuit illustrated in FIG. 9 may further include more differences, these differences include, but are not limited to: the disconnection of the transistor T2 from the data line (that is, the data line signal is no longer accepted), the disconnection of the transistor T2 from the node N2, and the disconnection of the transistor T6 from the OLED. The embodiments of the present disclosure do not limit these differences, and at least the first virtual sub-pixel can provide a compensation capacitor, but basically without affecting the display operation of the display region.

Figure 12A:
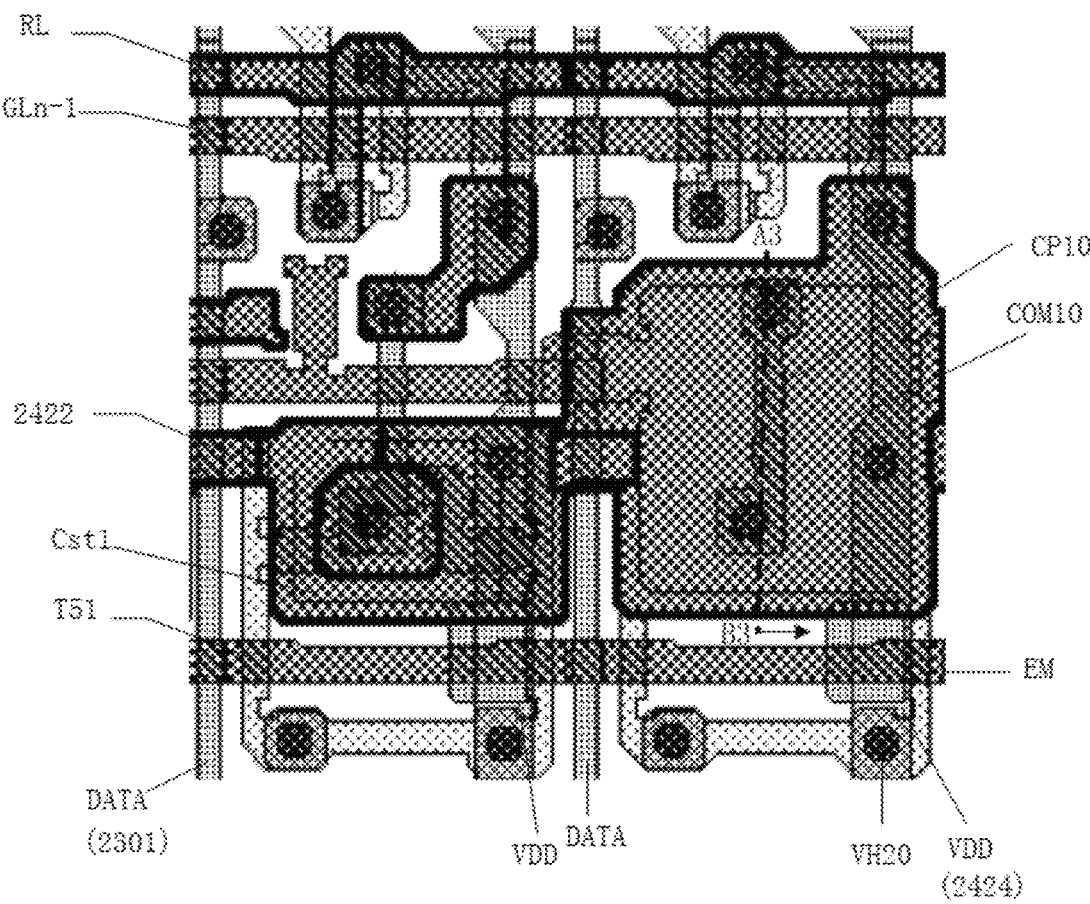
FIG. 12A is a schematic diagram of a planar layout of a second virtual pixel circuit in the display substrate according to at least one embodiment of the present disclosure.
Figure 12B:
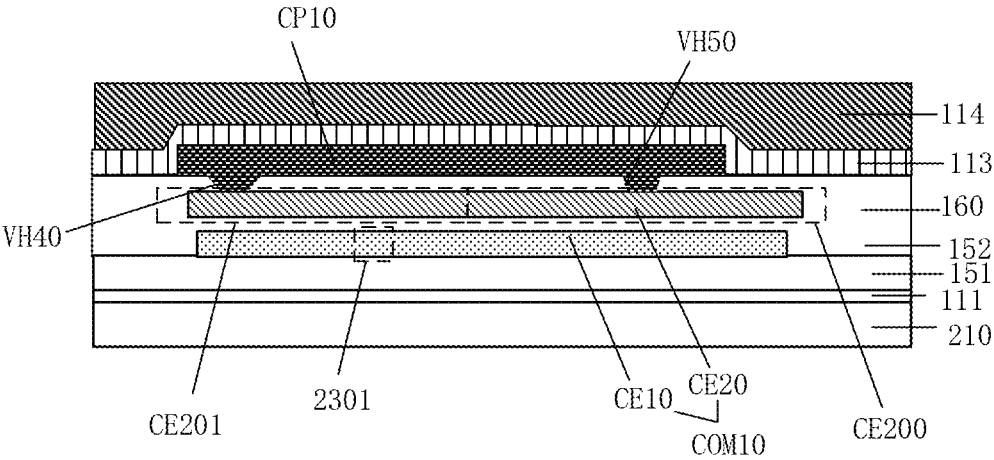
FIG. 12B is a cross-sectional schematic diagram taken along the line A3-B3 in FIG. 12A.

FIG. 12A is a schematic diagram of a planar layout of a second virtual pixel circuit of a second virtual sub-pixel (the virtual sub-pixel on the right side of the figure) in a display substrate according to at least one embodiment of the present disclosure; FIG. 12B is a cross-sectional schematic diagram taken along a line A3-B3 in FIG. 12A; and FIG. 12C to FIG. 12F are schematic diagrams of each layer of a second virtual pixel circuit of a display substrate provided by an embodiment of the present disclosure.

In some embodiments, for example, the inter-opening region 2014 further includes a second virtual sub-pixel, the second virtual sub-pixel includes a second virtual pixel circuit, as illustrated in FIG. 12A. The second virtual pixel circuit includes a second compensation capacitor COM10, the second compensation capacitor COM10 includes a first electrode plate CE10 and a second electrode plate CE20.

Figure 12C:
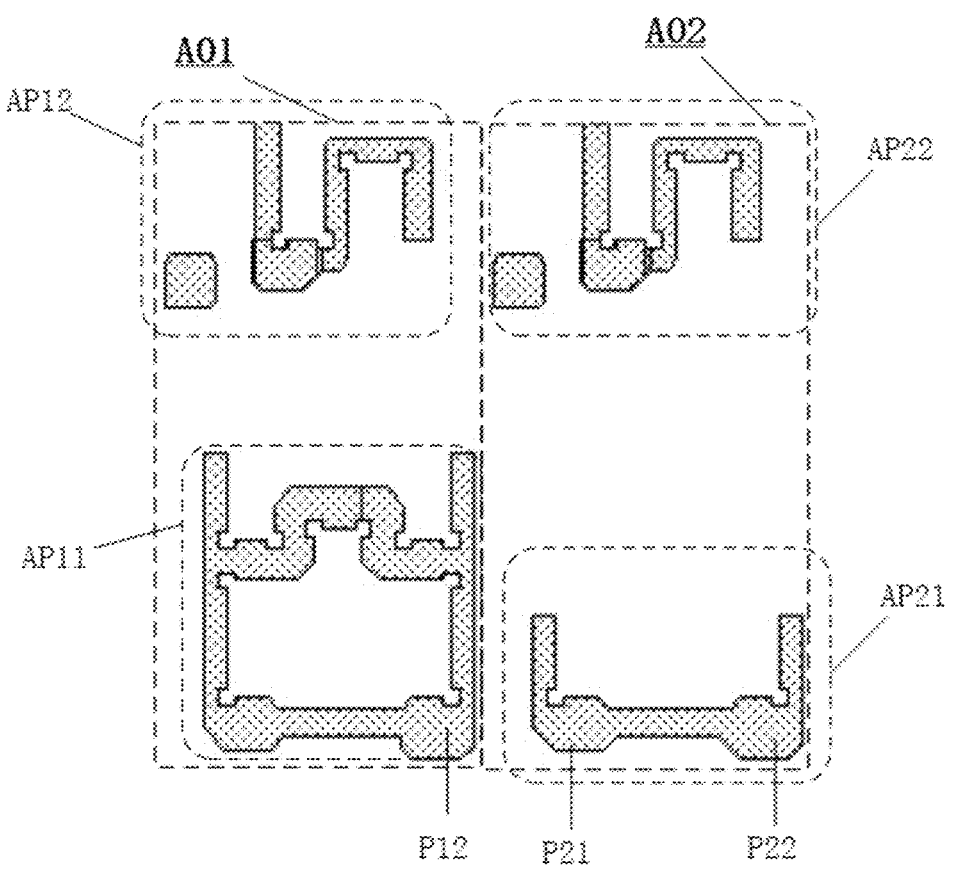
FIGS. 12C to 12F are schematic diagrams of each layer of the second virtual pixel circuit of the display substrate provided by at least one embodiment of the present disclosure.
Figure 12D:
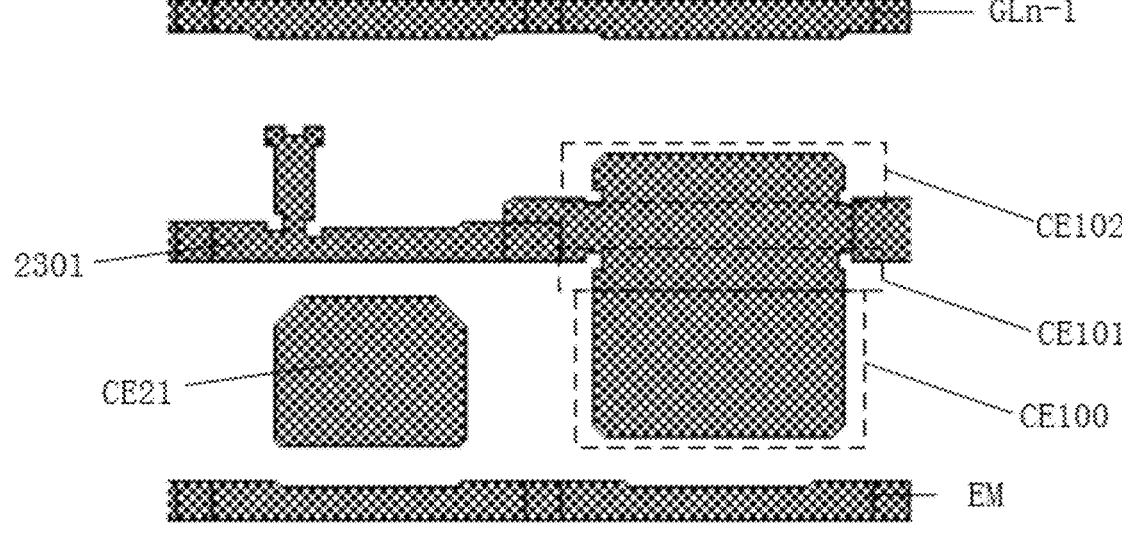
Figure 12E:
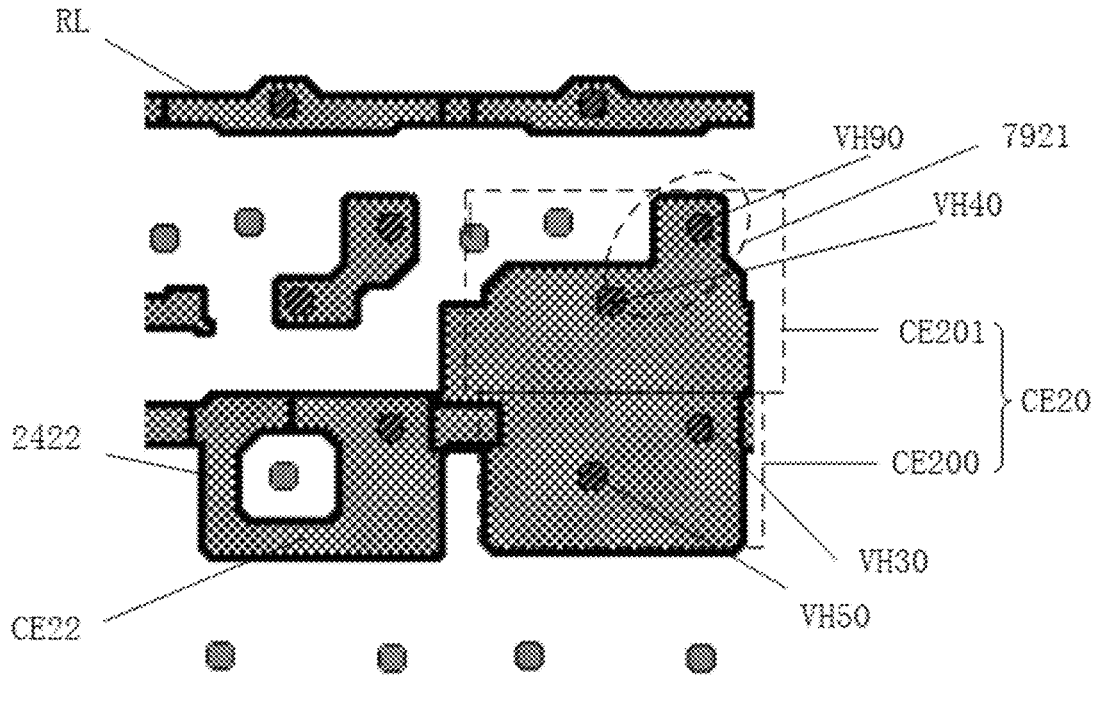

FIG. 12D shows a structure of the second virtual pixel circuit located on the first conductive layer, and FIG. 12E shows a structure of the second virtual pixel circuit in the second conductive layer.

Combining FIG. 12A to FIG. 12B and FIG. 12D to FIG. 12E, the first electrode plate CE10 of the second compensation capacitor COM10 and the first signal line 2301 are in a same layer, for example, both are located on the first conductive layer, and the first electrode plate CE10 of the second compensation capacitor COM10 is electrically connected to the first signal line 2301. An orthographic projection of the first signal line 2301 on the base substrate 210 at least partially overlaps with an orthographic projection of the second electrode plate CE20 of the second compensation capacitor COM10 on the base substrate 210.

As illustrated in FIG. 12D, the first electrode plate CE10 of the second compensation capacitor COM10 includes: a second body portion CE100 and a third extension portion CE101. The second body portion CE100 is located on the first side of the first signal line 2301 in the second direction R2; the third extension portion CE101 extends from the second body portion CE100 toward the first signal line 2301 in the second direction R2, is located on the first side of the first signal line 2301 in the second direction, and is located between the second body portion CE100 and the first signal line 2301; the second body portion CE100 is electrically connected to the first signal line 2301 through the third extension portion CE101. For example, the first electrode plate CE20 of the second compensation capacitor COM10 includes a fourth extension portion CE102, the fourth extension portion CE102 extends from the first signal line 2301 in a direction away from the second body portion CE100, and is located on the second side of the first signal line 2301 in the second direction R2 and is electrically connected to the first signal line 2301, and the second side of the first signal line 2301 is opposite to the first side of the first signal line 2301, so that an area of the first electrode plate CE10 of the second compensation capacitor COM10 is further increased, if the area of the second electrode plate of the second compensation capacitor COM10 is increased at the same time, the second compensation capacitor COM10 can be further increased, to meet the requirements of different compensation levels for the first signal line.

For example, the second body portion CE100, the third extension portion CE101, the first signal line 2301 and the fourth extension portion CE102 are integral, so that these structures may be formed by one same patterning process, which simplifies the manufacturing process of the display substrate.

Combining FIG. 12A to FIG. 12B and FIG. 12E, the second electrode plate CE20 of the second compensation capacitor COM10 includes a third body portion CE200 and a fifth extension portion CE201. The third body portion CE200 is located on the first side of the first signal line 2301 in the second direction R2; the fifth extension portion CE201 extends from the third body portion CE200 toward the first signal line 2301 in the second direction R2, and the orthographic projection of the first signal line 2301 on the base substrate 210 at least partially overlaps with an orthographic projection of the fifth extension portion CE201 on the base substrate 210.

For example, as illustrated in FIG. 12B, an orthographic projection of the first electrode plate CE10 of the second compensation capacitor COM10 on the base substrate 210 is located within the orthographic projection of the second electrode plate CE20 of the second compensation capacitor COM10 on the base substrate 210, to maximize the use of the area of the first electrode plate CE10 of the second compensation capacitor COM10, and a limited space is used to form a required size of the second compensation capacitor.

For example, as illustrated in FIG. 12E, a position and a pattern of a part 7921 of the second electrode plate CE20 of the second compensation capacitor COM10 can be the same as a position a pattern of the light shielding component in the pixel circuit of the display region, to maintain uniformity of etching.

For example, the second virtual sub-pixel includes a second virtual semiconductor layer, and the second virtual semiconductor layer is located on a side of the first electrode plate of the second compensation capacitor close to the base substrate. FIG. 12C shows a pattern of the second virtual sub-pixel, and the second virtual sub-pixel is the virtual sub-pixel A02 on the right side in FIG. 12C. Combining FIG. 12A and FIG. 12C, the second virtual semiconductor layer includes a first part AP21 and a second part AP22 spaced apart so as not to be connected to each other; the first part AP21 is located on the first side of the first signal line 2301, and the second part AP22 is located on the second side of the first signal line 2301; the orthographic projection of the first signal line 2301 on the base substrate 210 does not overlap with the orthographic projection of the first virtual semiconductor layer on the base substrate 210, so that no real thin film transistor is provided in the second virtual pixel circuit, and the display function is not realized. For example, the orthographic projection of the second compensation capacitor COM10 on the base substrate 210 does not overlap with the orthographic projection of the first virtual semiconductor layer on the base substrate.

Figure 12F:
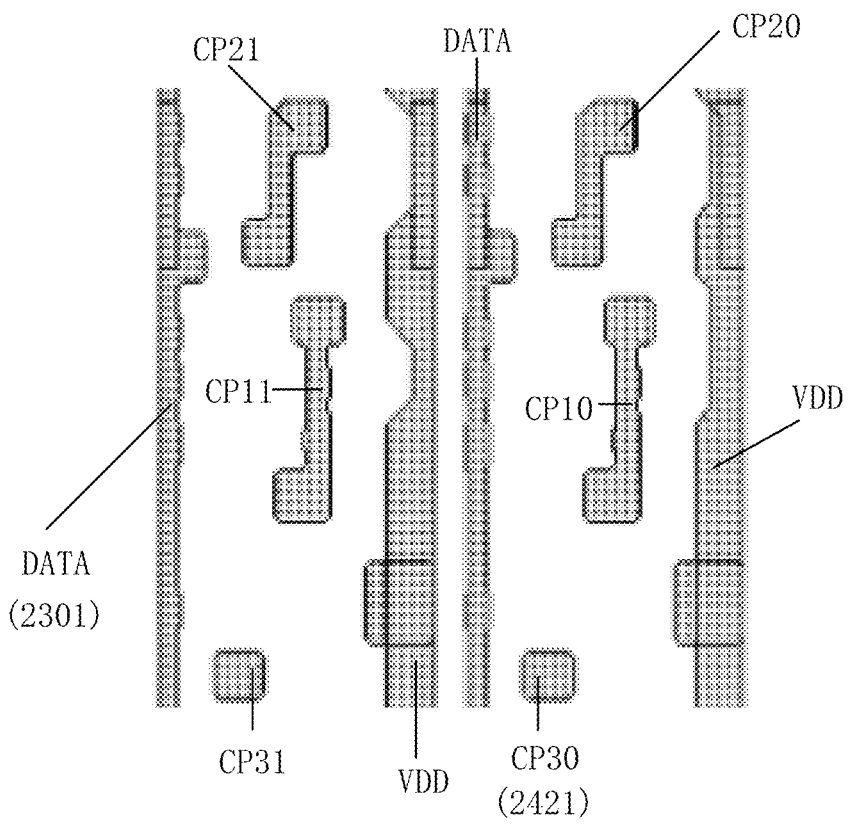

FIG. 12F shows a structure of the second virtual pixel circuit on the third conductive layer. Combining FIG. 12A to FIG. 12B, FIG. 12E and FIG. 12F, the second virtual pixel circuit includes a second transfer electrode CP10, the second transfer electrode CP10, the first transfer electrode of the first virtual pixel circuit, and the first connection component CP1 of the pixel circuit in the display region are in a same layer, for example, they are all located on the third conductive layer, and the second transfer electrode CP10 is electrically connected to the second electrode plate CE20 of the second compensation capacitor COM10, for example, the second transfer electrode CP10 is electrically connected to the second electrode plate CE20 of the second compensation capacitor COM10 through the via hole VH40 and the via hole VH50, to maintain the uniformity of etching at this position and other positions such as the display region of the display substrate.

For example, combining FIG. 12A to FIG. 12B and FIG. 12E, the second electrode plate CE20 of the second compensation capacitor COM10 is connected to the first power line VDD through the via hole VH40 and the via hole VH50, for example, is connected to the first wiring 2424 of the first power line VDD, to provide the first power voltage to the second electrode plate CE20 of the second compensation capacitor COM10, and to form the second compensation capacitor COM10.

For example, second parts AP22 of the second virtual semiconductor layer are all configured to be sent electrical signals through the second virtual pixel circuit; a first part AP21 of the first virtual semiconductor layer has a first end P21 and a second end P22 opposite to each other in the first direction R1, the second end P22 is configured to be sent the electrical signal through the second virtual pixel circuit, and the first end P21 is connected to the second end P22, so that the electrical signal from the second end P2 can be transmitted to the first end P21, and signal drift caused by the factor that no signal is input at the first end P21 can be avoided. For example, as illustrated in FIG. 12A, the second end P22 is electrically connected to the second sub-wiring 2424 of the first power line VDD, for example, the second end P22 is electrically connected to the second sub-wiring 2424 of the first power line VDD by the via hole VH20, so that the first power supply voltage from the second sub-wiring 2424 of the first power line VDD is transmitted to the second end P22 and the first end P21.

For example, in order to maintain etching uniformity, the inter-opening region 2014 further includes third virtual sub-pixels (the virtual sub-pixels A01 on the left side in FIG. 12C), each of the third virtual sub-pixels includes a third virtual pixel circuit, the third virtual pixel circuit includes a third virtual semiconductor layer, and the third virtual semiconductor layer is arranged in the same layer as both the second virtual semiconductor layer and the first virtual semiconductor layer. The third virtual semiconductor layer includes a first part AP11 and a second part AP12 spaced apart so as not to be connected to each other, the first part AP11 of the third virtual semiconductor layer is located on the first side of the first signal line 2301, the first part AP11 of the third virtual semiconductor layer is located on the second side of the first signal line 2301; and the orthographic projection of the first signal line 2301 on the base substrate 210 does not overlaps with an orthographic projection of the third virtual semiconductor layer on the base substrate, so that no real thin film transistor is formed in the third virtual sub-pixels, and the third virtual sub-pixels do not perform a display function.

For example, as illustrated in FIG. 8B and FIG. 8C, the second virtual semiconductor layer is not arranged in an outer area 2015 of the inter-opening region 2014 close to the display region, but a third virtual pixel circuit is arranged, to maintain the etching uniformity between the outer area 2015 and the display region, and to avoid affecting the display uniformity.

For example, in some embodiments, except that the second virtual semiconductor layer is disconnected, the third virtual pixel circuit has a same circuit design as the pixel circuit of the sub-pixel in the display region. For example, the connection structure CP11/CP21/CP31 of the third virtual pixel circuit in FIG. 12F has a same pattern as the connection structure at the corresponding position in the pixel circuit. For example, the position and pattern of the connection structure CP11/CP21/CP31 of the third virtual pixel circuit and the position and pattern of the connection structure CP10/CP20/CP30 of the second virtual pixel circuit are also the same, to maintain etching uniformity. Alternatively, the positions of a part of the signal lines of the third virtual pixel circuit and the positions of the corresponding signal lines in the pixel circuit may be different, for example, as illustrated in FIG. 12E, the first power line VDD is located on the right side of the data line DATA and is not adjacent to the data line DATA, but in the pattern of the third conductive layer of the pixel circuit illustrated in FIG. 5F, the first power line VDD is adjacent to the data line DATA. In the sub-pixels, the first virtual sub-pixels, the second virtual sub-pixels, and the third virtual sub-pixels in the display region, the specific patterns of each layer can be adjusted or fine-tuned according to requirements, which are not specifically limited herein. For example, in the third virtual sub-pixel, the light-emitting device is provided with the first electrode but not provided with the second electrode, so that the third virtual sub-pixel does not emit light.

Figure 13A:
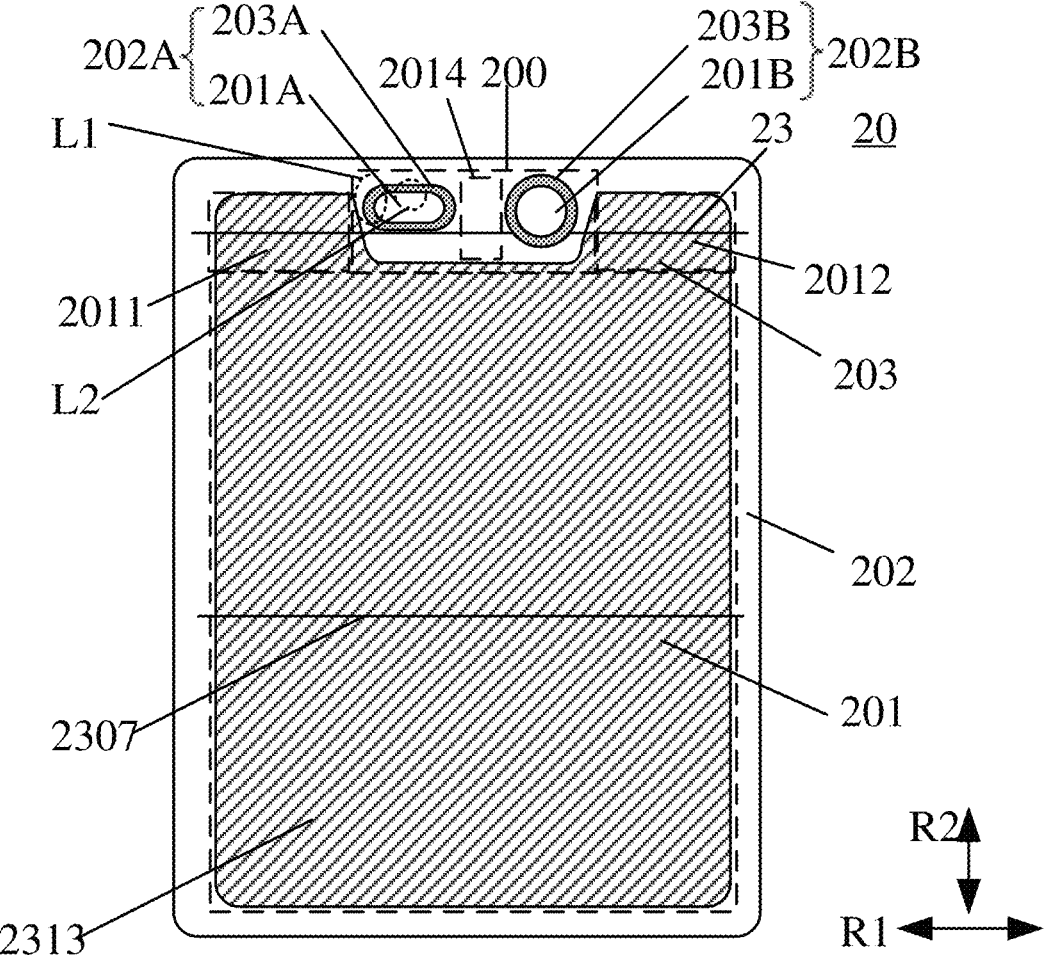
FIG. 13A is a planar schematic diagram of still another display substrate according to at least one embodiment of the disclosure.
Figure 13B:
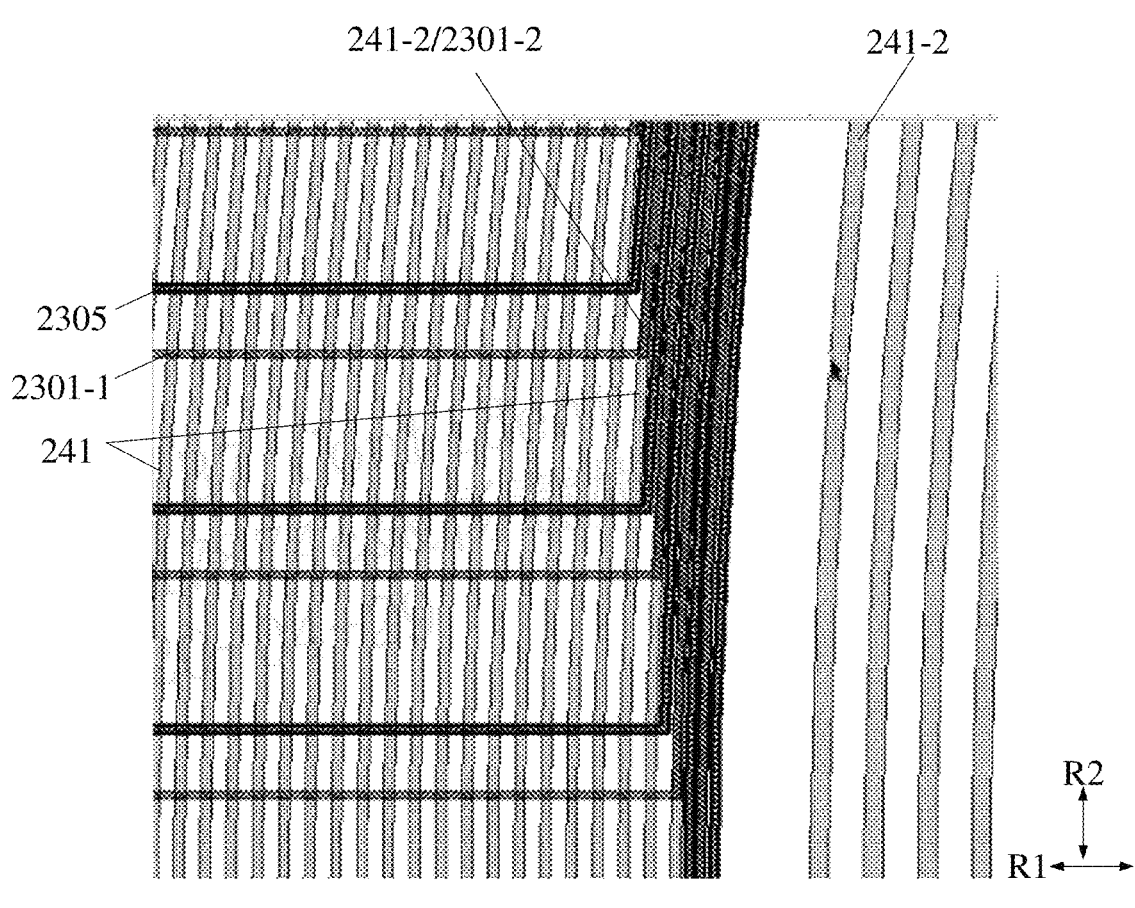
FIG. 13B is an enlarged schematic diagram of the part L1 of a racetrack-shaped opening including an arc-shaped wiring of FIG. 13A.
Figure 13C:
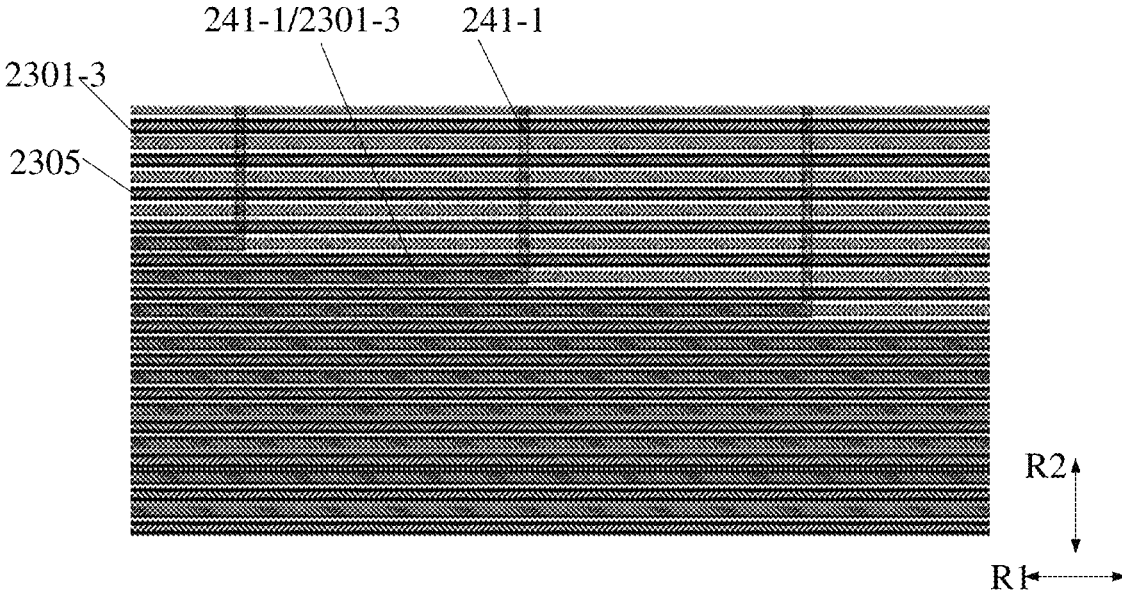
FIG. 13C is an enlarged schematic diagram of the part L2 of a racetrack-shaped opening including a straight line wiring of FIG. 13A.

FIG. 13B is an enlarged schematic diagram of the part L1 of a racetrack-shaped opening including an arc-shaped wiring of FIG. 13A; and FIG. 13C is an enlarged schematic diagram of the part L2 of a racetrack-shaped opening including a straight line wiring of FIG. 13A. In this case, the first display region 2011 is located on the first side of the first opening region 202A, and the second display region 2012 is located on the second side of the second opening region 201B. For the first opening region 202A and the second opening region 201B, respectively, it is still satisfied that the first display region 2011 is located on the first side of the first opening region 202A, the second display region 2012 is located on the second side of the first opening region 202A, and the first side and the second side are opposite to each other in the first direction R1.

As illustrated in FIG. 13B, in some embodiments, the planar shape of the first opening region 202A is a racetrack shape, the planar shape of the first opening 201A included in the first opening region 202A is also a racetrack shape, and the first signal line 2301/2305 at least partially surrounding the first opening 201A includes arc-shaped and straight-line segments.

As illustrated in FIG. 13B, a straight-line part 2301-1 of the first signal line from the first display region 2011 continues to extend to partially surround the first opening 201A, the first winding line portion of the first signal line surrounding the first opening 201A includes an arc-shaped part 2301-2. The second winding line portion of the second signal line extending in the second direction also includes an arc-shaped part 241-2. For example, the arc-shaped part 2301-2 of the first winding line portion partially overlaps with the arc-shaped part 241-2 of the second winding line portion in a direction perpendicular to the base substrate.

As illustrated in FIG. 13C, in the first opening peripheral region, the first winding line portion of the first signal line includes a straight-line part 2301-3. The second winding line portion of the second signal line extending in the second direction also includes a straight-line part 241-1. For example, the straight-line part 2301-3 of the first winding line portion of the first signal line partially overlaps with the straight-line part 241-1 of the second winding line portion of the second signal line in the direction perpendicular to the base substrate.

For example, in FIG. 13B and FIG. 13C, the first signal line including the straight-line part 2301-1/2301-3 and the arc-shaped portion 2301-2 is a gate scanning signal line, the gate scanning signal line partially overlaps with the second signal line; the first signal line 2305 is a light-emitting control line, or in other embodiments, the light-emitting control line may partially overlap with the second signal line.

At least one embodiment of the present disclosure provides a display apparatus including any one of the display substrates mentioned above. The display apparatus may be a device with a display function, such as an organic light-emitting diode display apparatus, and a quantum dot light-emitting diode display apparatus, or other types of devices, which are not limited in the embodiments of the present disclosure.

The structures, functions, and technical effects of the display apparatus provided by the embodiment of the present disclosure, can refer to the corresponding descriptions in the display substrate provided by the above-mentioned embodiments of the present disclosure, which are omitted herein.

For example, the display apparatus provided by at least one embodiment of the present disclosure may be any product or component with a display function, such as a display panel, a mobile phone, a tablet computer, a television, a monitor, a notebook computer, a digital photo frame, and a navigator, which are not limited in the embodiments of the present disclosure.

What are described above is related to only the illustrative embodiments of the present disclosure and not limitative to the protection scope of the present application. Therefore, the protection scope of the present application shall be defined by the accompanying claims.

What is claimed is:
1. A display substrate, comprising:
a base substrate, comprising:

a first opening region comprising a first opening and a first opening peripheral region surrounding the first opening;
a display region which at least partially surrounds the first opening region and comprises:
a first display region on a first side of the first opening region; and
a second display region on a second side of the first opening region, wherein the first side and the second side are opposite to each other in a first direction, and a whole of the first display region and the second display region comprises a first pixel array; the first pixel array comprises a plurality of rows of pixels disconnected by the first opening region;
first signal lines, wherein each of the first signal lines is configured to provide a first display signal to the first pixel array, sequentially passes through the first display region, the first opening peripheral region, and the second display region along the first direction, and comprises a first lead line portion and a first winding line portion that are in the first opening peripheral region, wherein the first winding line portion partially surrounds the first opening, and the first lead line portion is connected to the first winding line portion; and
second signal lines, wherein each of the second signal lines is configured to provide a second display signal to the first pixel array, passes through the first opening peripheral region in a second direction intersecting the first direction, and comprises a second winding line portion in the first opening peripheral region, wherein the second winding line portion partially surrounds the first opening, wherein
an orthographic projection of the first lead line portion on the base substrate and an orthographic projection of the second signal line on the base substrate have a first overlapping region, an orthographic projection of the first winding line portion on the base substrate and an orthographic projection of the second winding line portion on the base substrate have a second overlapping region;
each of the first signal lines and a corresponding second signal line of the second signal lines form the first overlapping region and the second overlapping region;
the first lead line portion of each of the first signal lines located on the first side of the first opening region has a first terminal point connected to the first winding line portion;
a portion, except the first terminal point, of the first lead line portion of each first signal line among part of the first signal lines forms the first overlapping regions with each of the second signal lines.
2. The display substrate according to claim 1, wherein the first winding line portion extends around the first opening from the first side of the first opening to the second side of the first opening, and the first side of the first opening and the second side of the first opening are opposite to each other in the first direction; and
the second winding line portion extends around the first opening from a third side of the first opening to a fourth side of the first opening, and the third side and the fourth side are opposite to each other in the second direction.
3. The display substrate according to claim 1, wherein the first pixel array comprises a first pixel row and a second pixel row that respectively extend along the first direction, and the first pixel row and the second pixel row are both disconnected by the first opening region;

the first signal lines comprise:

the first signal line configured to provide the first display signal to the first pixel row, wherein the first winding line portion of the first signal line providing the first display signal to the first pixel row partially surrounds the first opening on a third side of the first opening; and the first signal line configured to provide the first display signal to the second pixel row, wherein the first winding line portion of the first signal line providing the first display signal to the second pixel row partially surrounds the first opening on a fourth side of the first opening.

4. The display substrate according to claim 3, wherein the first pixel array comprises a first pixel column and a second pixel column that respectively extend along the second direction;

the second signal lines comprise:

the second signal line configured to provide the second display signal to the first pixel column, wherein the second winding line portion of the second signal line providing the second display signal to the first pixel column protrudes toward the first side of the first opening and partially surrounds the first opening on the first side of the first opening; and the second signal line configured to provide the second display signal to the second pixel column, wherein the second winding line portion of the second signal line providing the second display signal to the second pixel column protrudes toward the second side of the first opening and partially surrounds the first opening on the second side of the first opening.

5. The display substrate according to claim 4, wherein the first winding line portion of the first signal line providing the first display signal to the first pixel row, and the first winding line portion of the first signal line providing the first display signal to the second pixel row are substantially symmetrical with respect to a symmetry axis along the first direction; and the second winding line portion of the second signal line providing the second display signal to the first pixel column, and the second winding line portion of the second signal line providing the second display signal to the second pixel column are substantially symmetrical with respect to a symmetry axis along the second direction.

6. The display substrate according to claim 1, wherein a planar shape of the first winding line portion and a planar shape of the second winding line portion respectively constitute a part of a concentric ring of a planar shape of the first opening; and an area of the first overlapping region is smaller than an area of the second overlapping region.

7. The display substrate according to claim 1, wherein a planar shape of the first winding line portion and a planar shape of the second winding line portion respectively comprise an arc shape, or respectively comprise an arc shape and a straight line segment.

8. The display substrate according to claim 1, wherein the first signal line is a gate scanning signal line, and the first display signal is a gate scanning signal.

9. The display substrate according to claim 1, wherein the display region comprises a plurality of pixels, each of the pixels comprises a plurality of sub-pixels, each of the sub-pixels comprises a pixel circuit, and the pixel circuit comprises:

a transistor comprising an active layer, a gate electrode, a source electrode and a drain electrode;

a light-emitting element connected to one of the source electrode and the drain electrode of the transistor; and a storage capacitor comprising a first electrode plate and a second electrode plate, wherein the gate electrode, the first signal line and the first electrode plate of the storage capacitor are in a same layer.

10. The display substrate according to claim 9, further comprising:

a third display region, wherein the third display region is on at least one side of both the first display region and the second display region in the second direction, the third display region is connected to both the first display region and the second display region, the third display region comprises a second pixel array, and the second pixel array comprises a plurality of rows of pixels and a plurality of columns of pixels; and a plurality of third signal lines which are configured to respectively provide a third display signal to the plurality of rows of pixels comprised in the second pixel array and extend along the first direction, wherein the second signal line is further configured to provide the second display signal to the plurality of columns of pixels of the second pixel array.

11. The display substrate according to claim 10, wherein a total number of pixels comprised in each row of pixels of the second pixel array is more than a total number of pixels comprised in the first pixel row of the first pixel array and is more than a total number of pixels comprised in the second pixel row of the first pixel array.

12. The display substrate according to claim 10, wherein the second signal line comprises:

a data line configured to provide a data signal to at least part of the sub-pixels for controlling a light-emitting gray value of the at least part of the sub-pixels.

13. The display substrate according to claim 12, further comprising:

a first power line which is connected to a first voltage terminal, is configured to provide a first power supply voltage to the pixel circuit, is connected to the second electrode plate of the storage capacitor, and comprises a plurality of first sub-wirings extending along the first direction and a plurality of second sub-wirings extending along the second direction, wherein a first part of first sub-wirings among the plurality of first sub-wirings are disconnected in the first opening region, and a second part of first sub-wirings among the plurality of first sub-wirings pass through the third display region;

the first part of second sub-wirings among the plurality of second sub-wirings are disconnected in the first opening region, the second part of second sub-wirings among the plurality of second sub-wirings sequentially pass through the first display region and the third display region, or sequentially pass through the second display region and the third display region; and the first part of first sub-wirings are electrically connected respectively in the first display region and the second display region with at least one second sub-wiring of the second part of second sub-wirings, and the first part of second sub-wirings are electrically connected in the third display region with at least one first sub-wiring in the second part of the first sub-wirings.

14. The display substrate according to claim 13, wherein the first sub-wirings and the second electrode plate of the storage capacitor are in a same layer; and the second sub-wirings and the data line are in a same layer.

15. The display substrate according to claim 10, further comprising:

a first power line, wherein the first power line is connected to a first voltage terminal and is configured to provide a first power voltage to the pixel circuit, the first power line is connected to the second electrode plate of the storage capacitor, and the first power line comprises a plurality of first sub-wirings extending along the first direction and a plurality of second sub-wirings extending along the second direction; and the second signal line comprises the second sub-wirings, and a part of second sub-wirings among the plurality of second sub-wirings passes through the first opening peripheral region and the third display region.

16. The display substrate according to claim 10, further comprising:

a second opening region, wherein the second opening region is adjacent to the first opening region, and the second opening region comprises a second opening and a second opening peripheral region surrounding the second opening; and an inter-opening region between the first opening region and the second opening region.

17. The display substrate according to claim 16, wherein the second opening region and the first opening region are arranged along the first direction;

the first display region is on a side of the first opening region away from the inter-opening region, the second display region is on a side of the second opening region away from the inter- opening region; and the first signal line sequentially passes through the first display region, the first opening peripheral region, the inter-opening region, the second opening peripheral region, and the second display region along the first direction.

18. The display substrate according to claim 16, wherein the second opening region and the first opening region are arranged along the second direction; and the second signal line sequentially passes through the first opening peripheral region, the inter-opening region, the second opening peripheral region, and the third display region along the second direction.

19. The display substrate according to claim 16, wherein at least one selected from a group consisting of the inter-opening region, the first opening peripheral region, and the second opening peripheral region comprises a first virtual sub-pixel, the first virtual sub-pixel comprises a first virtual pixel circuit, and the first virtual pixel circuit comprises a first compensation capacitor;

the first compensation capacitor comprises:

a first electrode plate which is in a same layer as the first signal line and is electrically connected to the first signal line; and a second electrode plate, wherein the second electrode plate and the first electrode plate of the first compensation capacitor are in different layers, the second electrode plate of first compensation capacitor is insulated from the first electrode plate of the first compensation capacitor, and an orthographic projection of the first electrode plate of the first compensation capacitor on the base substrate at least partially overlaps with an orthographic projection of the second electrode plate of the first compensation capacitor on the base substrate.

20. A display apparatus, comprising the display substrate according to claim 1.

* * * * *